US009967978B1

(12) United States Patent
Eiermann et al.

(10) Patent No.: US 9,967,978 B1
(45) Date of Patent: May 8, 2018

(54) METHODS AND APPARATUS FOR A RAIL-MOUNTED ARRAY ASSEMBLY

(71) Applicant: Raytheon Company, Waltham, MA (US)

(72) Inventors: Robert Eiermann, Framingham, MA (US); Paul J. Gavin, Kingston, NH (US); Steven D. Bernstein, Brighton, MA (US); David L. Hall, Nashua, NH (US)

(73) Assignee: Raytheon Company, Waltham, MA (US)

( * ) Notice: Subject to any disclaimer, the term of this patent is extended or adjusted under 35 U.S.C. 154(b) by 9 days.

(21) Appl. No.: 15/060,471

(22) Filed: Mar. 3, 2016

(51) Int. Cl.
*H05K 7/14* (2006.01)
*H05K 1/14* (2006.01)
*H05K 1/02* (2006.01)
*H05K 3/36* (2006.01)
*H05K 13/00* (2006.01)
*H05K 7/20* (2006.01)

(52) U.S. Cl.
CPC .......... *H05K 1/144* (2013.01); *H05K 1/0203* (2013.01); *H05K 3/36* (2013.01); *H05K 13/0023* (2013.01); *H05K 7/1404* (2013.01); *H05K 7/20636* (2013.01)

(58) Field of Classification Search
CPC .... H05K 7/1404; H05K 7/20636; H05K 3/36; H05K 1/144; H05K 13/0023; H05K 1/0203; G06F 1/20
See application file for complete search history.

(56) References Cited

U.S. PATENT DOCUMENTS

| 3,904,933 | A | * | 9/1975 | Davis | H05K 7/1404 |
| | | | | | 165/80.4 |
| 4,962,444 | A | * | 10/1990 | Niggemann | H05K 7/20645 |
| | | | | | 165/80.4 |
| 7,508,670 | B1 | * | 3/2009 | Thorson | H05K 7/20636 |
| | | | | | 165/104.33 |
| 9,526,191 | B2 | * | 12/2016 | Straznicky | H05K 7/20 |
| 2007/0070601 | A1 | * | 3/2007 | Vos | H05K 7/20563 |
| | | | | | 361/694 |
| 2012/0063098 | A1 | * | 3/2012 | Paquette | H01L 23/4332 |
| | | | | | 361/721 |

* cited by examiner

*Primary Examiner* — James Wu

(57) ABSTRACT

A rear-loaded electronics array, comprising a first circuit board assembly comprising a rail and at least one slat assembly. The at least one slat assembly can be operable to be removed from the rail and replaced on the rail from a rearward position. A second circuit board assembly can comprise a rail and at least one slat assembly. The at least one slat assembly can be operable to be removed from the rail and replaced on the rail from a rearward position. The first circuit board assembly can be positioned adjacent the second circuit board assembly, and the first circuit board assembly can be coupled to the second circuit board assembly, thus forming the rear-loaded electronics array. The first and second circuit board assemblies can be installed and removed independent of one another, as well as each of the individual slat assemblies from any circuit board assembly.

15 Claims, 19 Drawing Sheets

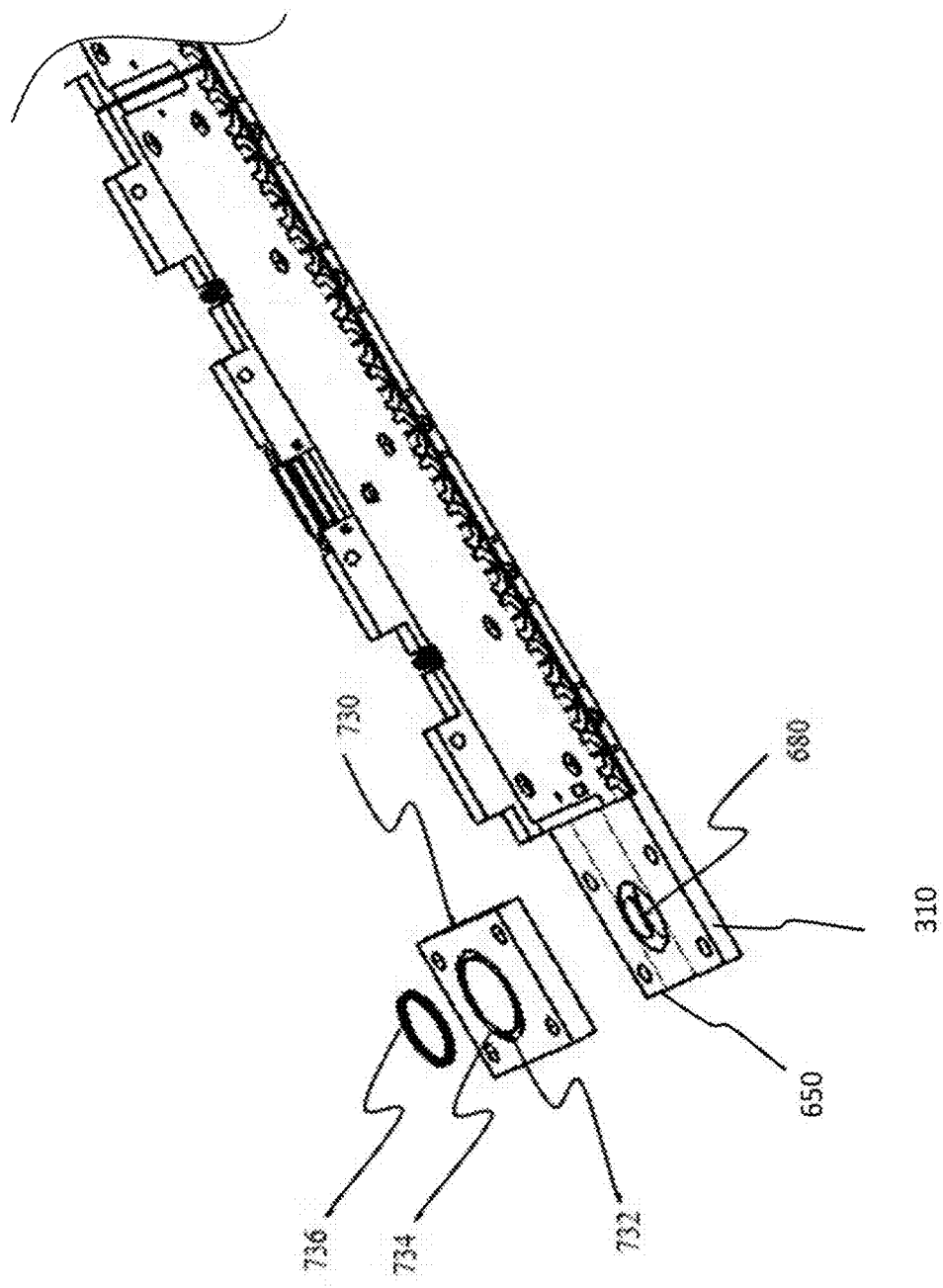

METHODS AND APPARATUS FOR A RAIL-MOUNTED ARRAY ASSEMBLY

BACKGROUND

Many electronics assemblies employing an array of card assemblies (CCAs) utilize front load array plates. For example, in recent years, advances have been made in the field of circuit boards utilizing micro-electro-mechanical systems (MEMS) phase shifters in various technology areas, for example, in radar systems. In a radar system employing a front load phase array, access to the array of CCAs can require removal of the radome, as well as special tools to remove and install the array plates.

Those electronics assemblies having an array of CCAs that utilize rear load array plates often separate the radiators from the MEMS phase shifter technology.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 11 is a partially exploded partial perspective view of an exemplary plugged spacer as part of the cooling system of FIG. 9;

Figure 1:
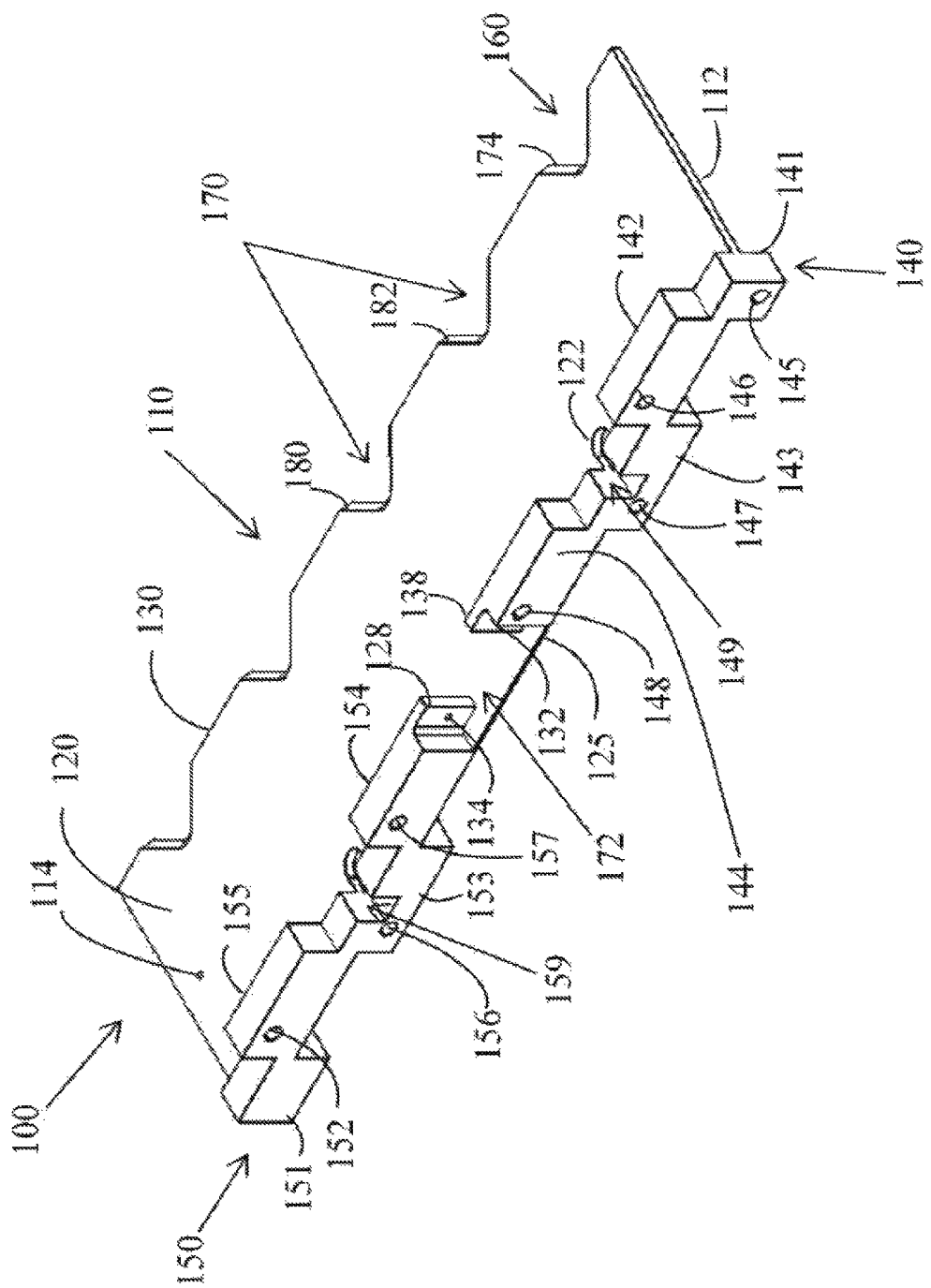
FIG. 1 is a perspective view of a carrier plate in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness can in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" can be either abutting or connected. Such elements can also be near or close to each other without necessarily contacting each other. The exact degree of proximity can in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

The present disclosure addresses the housing and/or support of circuit board assemblies or circuit card assemblies arranged in organized arrays, in which the circuit card assembly comprises, for example, MEMS phase shifters, radiators and switches (e.g., analog switches) on the same circuit card assembly. More specifically, the present disclosure sets forth a circuit board assembly. A plurality of circuit board assemblies can operate together to form a rear-loaded electronics array. The circuit board assemblies can comprise various components and configurations, as will be described herein below.

In one example, multiple slat assemblies can be configured and supported about a rail to form a circuit board assembly, and a plurality of circuit board assemblies (each having a plurality of rails and slat assemblies) can form an electronics array assembly that can be accessed from a rear position. Electronics array assemblies as formed in accordance with the technology discussed herein, can be useful in many commercial, military or defense applications. In one example, radar applications, and particularly in ship-based applications, the electronics array can provide significant benefits or advantages over prior related electronics devices or systems. For example, when dealing with ship-based radar applications, it would be preferable to perform maintenance, such as removing, repairing, and replacing electronics components, from a rearward position. However, prior electronics systems do not permit this due to their configuration. As such, in the case of a radar system, the radar's radome must be removed in order to obtain needed access. This can be time consuming and costly, as well as providing unnecessary exposure to the systems and components protected by the radome. Replacing current or prior electronics systems with the electronics array assembly technology discussed herein will enable repairs, maintenance, etc., all while enabling a radar system's radome to remain in place, thus protecting delicate systems protected by the radome. Of course, those skilled in the art will recognize that the present technology can be used in other applications. Such applications include, but are not limited to, single access card cages, high heat dissipation card cages, and others as will be recognized by those skilled in the art.

Figure 3A:
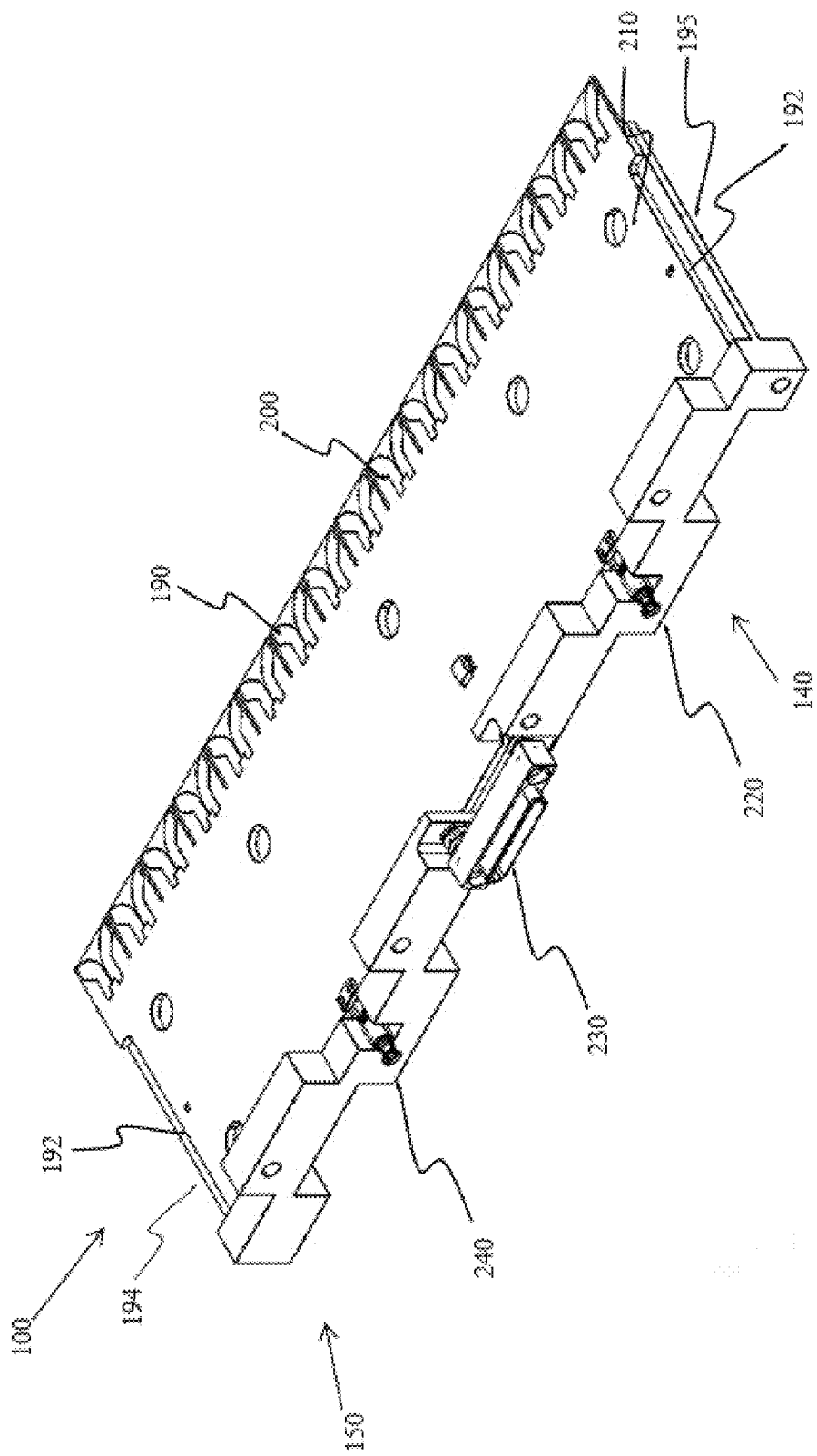
FIG. 3A is a perspective view of a slat assembly in accordance with an example of the present disclosure, the slat assembly comprising the carrier plate of FIG. 1 and an exemplary circuit board supported thereon.
Figure 3B:
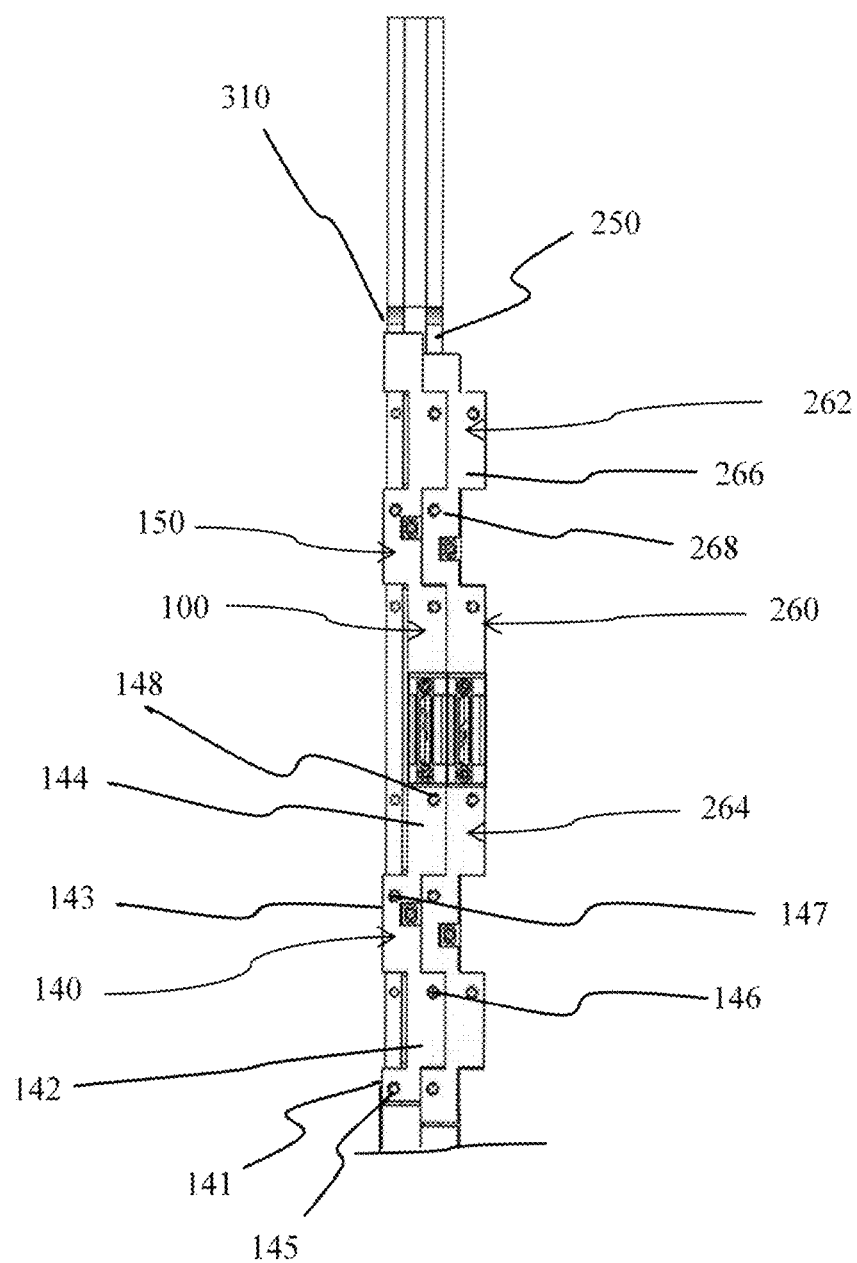
FIG. 3B is a partial elevation view of two circuit board assemblies in accordance with an example of the present disclosure, each of the circuit board assemblies comprising a rail as shown in FIG. 2 and a slat assembly as shown in FIG. 3A, the circuit board assemblies being coupled to one another.

With reference to FIGS. 1 and 3A-3B, an exemplary carrier plate, as part of a slat assembly to be described below, is shown. As shown, the carrier plate 100 can comprise a base 110 having a mounting surface 120. The mounting surface 120 can comprise a first edge 125 and a second edge 130 opposite the first edge 125. The mounting surface 120 can be operable to at least partially support a circuit board, circuit card, etc., such as the circuit board 190, as shown in FIG. 3A, which illustrates the circuit board 190 being mounted on and secured to the mounting surface 120 of the base 110 of the carrier plate 100. The circuit board 190 can further comprise a plurality of integrated dipole radiators 200 operable to electronically communicate with an external system. The plurality of integrated dipole radiators can be operable to receive information and to communicate that information to the circuit board 190.

In some embodiments the, circuit board 190 can be positioned on the mounting surface 120 such that an end portion 194 of the base 110 is exposed and an end portion 195 of the base 110 is exposed on an opposite end. Additionally, in some embodiments, the circuit board 190 can comprise openings 210 within the circuit board 190.

The circuit board 190 can be supported on the mounting surface 120 and can be coupled to the carrier plate 100, such as by an adhesive. One exemplary adhesive can comprise Hysol® CF 3350 film adhesive, and can be utilized to bond the circuit board 190 to the carrier plate 100. One skilled in the art will recognize that other adhesives or even other coupling means can be used to couple the circuit board to the mounting surface 120 of the carrier plate 100.

Coupling the circuit board 190 to the mounting surface 120 can prevent the circuit board 190 from moving relative to the carrier plate 100 during use, thereby preventing damage to the circuit board. Additionally, as will be discussed in more detail hereinafter, mounting the circuit board to the carrier plate 100 can facilitate the circuit board 190 to be removed and replaced from an electronics array, without damaging the circuit board 190. Furthermore, the base 110 and the carrier plate 100 can facilitate the dissipation of heat generated at the circuit board 190.

The base 110 can comprise a thin configuration in which its width is substantially greater than a height or thickness, as shown in FIG. 1. The base 110 can be formed of any material suited for the purpose of supporting and facilitating operation of an electronics component, such as a circuit board. In one example, the base 110 can be formed of an aluminum material, such as 6063-T6 aluminum. As one skilled in the art will recognize, the base 110 can comprise other appropriate materials or combination of materials having the properties suitable for accommodating the circuit board 190.

The base 110 can further comprise an aperture or opening 114 in the mounting surface 120, which can be aligned with an opening or aperture 192 in the circuit board 190. The opening 114 and the opening 192 can be configured to receive a fastener therethrough, providing additional securing support of the circuit board 190 to the mounting surface 120 of the carrier plate 100.

The carrier plate 100 can further comprise at least one array plate segment 140. In the embodiment shown, the array plate segment 140 is located about or along the first edge 125 of the carrier plate 100. The at least one array plate segment 140 can comprise a first lower member 141, a first upper member 142, a second lower member 143, and a second upper member 144. The first upper member 142 and the second upper member 144 can each extend above the mounting surface 120. The first lower member 141 and the second lower member 143 can extend below the mounting surface 120. This alternating configuration in which portions of the array plate segment 140 extend above and below the mounting surface 120 can be repeated along the length of the carrier plate 100 as necessary. In addition, the above and lower extending portions can be arranged in any other configuration besides alternating, as will be recognized by one skilled in the art.

The at least one array plate segment can further comprise a slot or channel 149. The slot or channel 149 can be operable to accommodate or receive and support at least one connector, such as a blind mate connector 220, as shown in FIG. 3. The at least one blind mate connector 220 can be coupled to the base 110 and to the circuit board 190, and can be operable to pass through the at least one slot or channel 149 to facilitate access to the blind mate connector 220 upon the carrier plate 100 being included within a circuit board assembly and an electronics array assembly, as discussed in more detail below.

The base 110 can further comprise an opening 122 that can accommodate a mounting structure (not shown) operable to support the blind mate connector 220 about the carrier plate 100. The at least one blind mate connector 220 can be operable to couple or connect with electronics devices or systems as known in the art.

The at least one array plate segment 140 can further comprise a connector interface 138 operable to secure a connector 230 to the array plate segment 140 about the carrier plate 100 and the circuit board 190. The connector interface 138 can be formed within or can comprise a portion of the array plate segment 140, and can further comprise at least one opening 132. The at least one opening 132 can be operable to accommodate or receive a fastener configured to couple the connector 230 to the at least one array plate segment 140. The connector 230 can be operable to couple or connect with electronics devices or systems as known in the art, and can facilitate electronic communication of such devices or systems with the circuit board 190.

The base 110 can further comprise a second array plate segment 150. As shown in FIG. 1, the second array plate segment 150 can be located about or along the first edge 125, opposite the first array plate segment 140. The second array plate segment 150 can comprise a first lower member 151, a first upper member 152, a second lower member 153, and a second upper member 154. The first upper member 152 and the second upper member 154 can each extend above the mounting surface 120. The first lower member 151 and the second lower member 153 can extend below the mounting surface 120. This alternating configuration can be formed and configured in a similar manner as the first array plate segment 140, or it may be different, as necessary or desired.

The second array plate segment 150 can further comprise a slot or channel 159. The slot or channel 159 can be operable to accommodate or receive a second connector, such as a second blind mate connector 240 (which can be similar in form and function as the first blind mate connector 220 discussed above), as shown in FIG. 3. The second blind mate connector 240 can be coupled to the base 110 and to the circuit board 190, and can be operable to pass through the at least one slot or channel 159 to facilitate access to the blind mate connector 240 upon the carrier plate being included within a circuit board assembly and an electronics array, as discussed in more detail below.

The second array plate segment 150 can further comprise a connector interface 128 operable to secure a connector 230 to the array plate segment 150 about the carrier plate 100 and the circuit board 190. The connector interface 128 can further comprise at least one opening 134, which can be operable to accommodate or receive a fastener configured to couple the connector 230 to the second array plate segment 150.

As illustrated in FIG. 1, there can be a space 172 between the first array plate segment 140 and the second array plate segment 150 along the first edge of the carrier plate 100. The space 172 can be operable to receive and accommodate the connector 230. The connector 230 can be operable to couple with external electronics to facilitate electrical communication with the circuit board 190. The connector 230 can comprise one of a variety of different types of connectors, such as a floating p/I connector, configured to be in electronic communication with an external electronics component. The connector 230 can further be operable to be in electronic communication with the circuit board 190 via a cable connection, such as a ribbon cable.

The array plate segments 140 and 150 can be integrally formed with the base 110 of the carrier plate 100. Alternatively, the array plate segments 140 and 150 can be separate from the base 110 and can be coupled to the base 110, such as by using fasteners, an interference fit, adhesives, or by other known methods, or a combination of these. Additionally, the array plate segments 140 and 150 can be formed of materials similar to or different from the material(s) used to form the base 110, such as 6063-T6 aluminum.

It is further noted that the array plate segment can comprise a single segment about or along the carrier plate 100 rather than consisting of two such segments. Moreover, the array plate segment(s) can be configured to comprise no spaces or gaps or slots therein, or alternatively, any number of spaces or gaps or slots therein. This will largely depend upon the access needed to the circuit board supported on the carrier plate 100, and the types of electronic components to be utilized.

Figure 2:
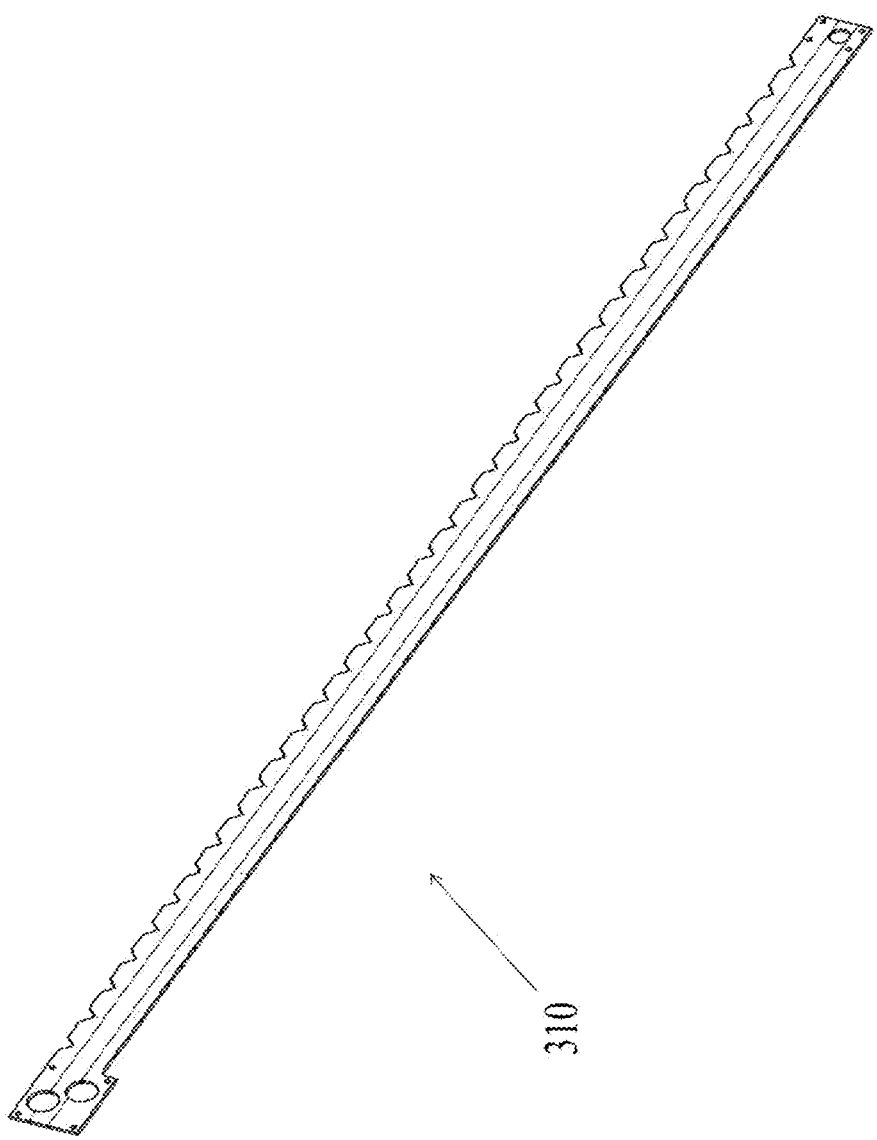
FIG. 2 is a perspective view of a rail in accordance with an example of the present disclosure.

With reference to FIGS. 1-3B, the carrier plate 100 can be configured to be operable with a rail, such as the exemplary rail 310 shown in FIG. 2, which can form a circuit board assembly as part of an electronics array assembly, as discussed in more detail below. The carrier plate 100 can facilitate the support of a circuit board about the rail 310, and can be at least partially secured or mounted to the rail 310 (e.g., about one side or edge) using fasteners, or other means/methods. In one aspect, the carrier plate 100 can be at least partially coupled to the rail about the first edge 125 of the carrier plate 100 using fasteners. In one specific aspect, the carrier plate 100 can be at least partially mounted to the rail via its array plate segment(s).

Referring to the array plate segment 140 of the carrier plate 100, the first lower member 141 can comprise an aperture 145. The second lower member 143 can comprise an aperture 147. Each of the apertures 145 and 147 can be operable to accommodate a fastener configured to engage or fasten to a rail, thus at least partially securing the array plate segment 140 and the carrier plate to a rail (in this case the rail 310). As will be explained below, the array plate segment(s) of a carrier plate can be designed and configured to be secured to more than one rail. For example, the array plate segment(s) of a carrier plate can be secured to the rail upon which the carrier plate is mounted, and to an adjacent rail, depending upon the configuration of the array plate segments The first upper member 142 can comprise an aperture 146. The second upper member 144 can comprise an aperture 148. Each of the apertures 146 and 148 can be operable to accommodate a fastener configured to fasten to a rail, thus at least partially securing the array plate segment 140 to the rail.

Similarly, referring to the second array plate segment 150, the second lower member 153 can comprise an aperture 156. The aperture 156 can be operable to accommodate a fastener passing through the aperture and fastening to the rail, at least partially securing the second array plate segment 150 to the rail 310. The first upper member 155 can also comprise an aperture 152. The second upper member 154 can comprise an aperture 157. These apertures can be configured to also accommodate fasteners for facilitating coupling of the carrier plate 100 to a rail.

Although the foregoing describes how a first side, or in this case how the first edge 125, of the carrier plate 100 can be secured to the rail 310, it may further be necessary to secure a second side, or the second edge 130, of the carrier plate 100 to the rail 310. In one example used to illustrate how a second side or the second edge 130, as well as the circuit board 190, can be secured to the rail 310, the base 110 of the carrier plate 100 can further comprise a rail interface 160 on or about the second side 130. The rail interface 160 can be operable to facilitate at least partial securing of the carrier plate 100 to a rail of a circuit board assembly, as described herein below.

As illustrated in FIG. 1, the rail interface 160 can comprise a plurality of notches 170. The plurality of notches 170 can be formed in the base 110 along some or all of the second edge 130 of the base 110. In some embodiments, each of the plurality of notches can comprise a "V" shape, extending inward from the second edge 130 toward the first edge 125, and can have a rounded end 174. The plurality of notches 170 can be operable to interface with respective locking devices, described below, to secure the carrier plate 100 to the rail. The respective locking devices can comprise a shape operable to fit within the plurality of notches 170 to engage both the carrier plate 100 and the rail. The respective locking devices can provide further support and securing of the carrier plate 100 to the rail.

Additionally, each of the plurality of notches 170 can comprise a tapered edge 180. The tapered edge of the carrier plate 100 is described in more detail below with respect to FIGS. 4A and 4B. The respective locking devices can also comprise a corresponding tapered edge, such that the tapered edges of the respective locking devices are operable to mate or engage with the tapered edge 180 of each of the plurality of notches 170, securing the carrier plate 100 to the rail.

With reference to FIGS. 1 and 3B, the carrier plate 100, as mounted on a rail, can be configured to be coupled to a first and a second rail, such as the rail 310 and an adjacent rail 250, as illustrated in FIG. 3B. Rails 310 and 250 can each comprise a carrier plate interface. Referring to the at least one array plate segment 140 of the carrier plate 100, the first upper member 142, as extending above the base of the carrier plate 100, can comprise an opening or aperture 145 that facilitates coupling of the carrier plate 100 to the rail 250. Additionally, the second upper member 144, also extending above the base of the carrier plate 100, can comprise an opening or aperture 148 that facilitates coupling of the carrier plate 100 to the rail 250. Each of the openings or apertures 145 and 148 can be operable to accommodate a fastener operable to fasten the carrier plate to the adjacent rail 250, securing the at least one array plate segment 140 and the carrier plate 100 to the adjacent rail 250.

The first lower member 141 and the second lower member 143, as extending below the base of the carrier plate 100, can comprise respective apertures 145 and 147, which can facilitate coupling of the carrier plate to the rail 310. In this manner, the carrier plate 100 is coupled to two adjacent rails, thus providing durability and stability over coupling to a single rail, although one skilled in the art will recognize that the carrier plate 100 can be configured to be coupled only to a single rail.

Furthermore, the second array plate segment 150 of the carrier plate 100 can be configured similarly in that it can comprise upper and lower members as shown that extend above and below the base of the carrier plate 100, respectively, to facilitate coupling of the carrier plate 100 to the two adjacent rails, namely rails 310 and 250.

In another aspect, the array plate segment(s) (e.g., the at least one array plate segment 140 and the second array plate segment 150) can be operable to nest with the array plate segment or segments of a second carrier plate, particularly an adjacent carrier plate, as illustrated in FIG. 3B. In this example, the carrier plate 100 can be arranged in a nesting arrangement with the second carrier plate 260 mounted on rail 250, such that the array plate segment(s) (e.g., array plate segments 140 and 150) of the carrier plate 100 is/are caused to nest with the array plate segment(s) (e.g., array plate segments 262 and 264) of the second carrier plate 260. Referring to the at least one array plate segment 140 of the carrier plate 100, the various upper and lower members of the array plate segments 140 and 150 (see upper members 142 and 144, and lower members 141 and 143 of FIG. 1) can surround the various upper and lower members (e.g., upper members 266 and lower members 268) of the array plate segments 262 and 264 of the second carrier plate 260, thus forming a nesting configuration.

Figure 4A:
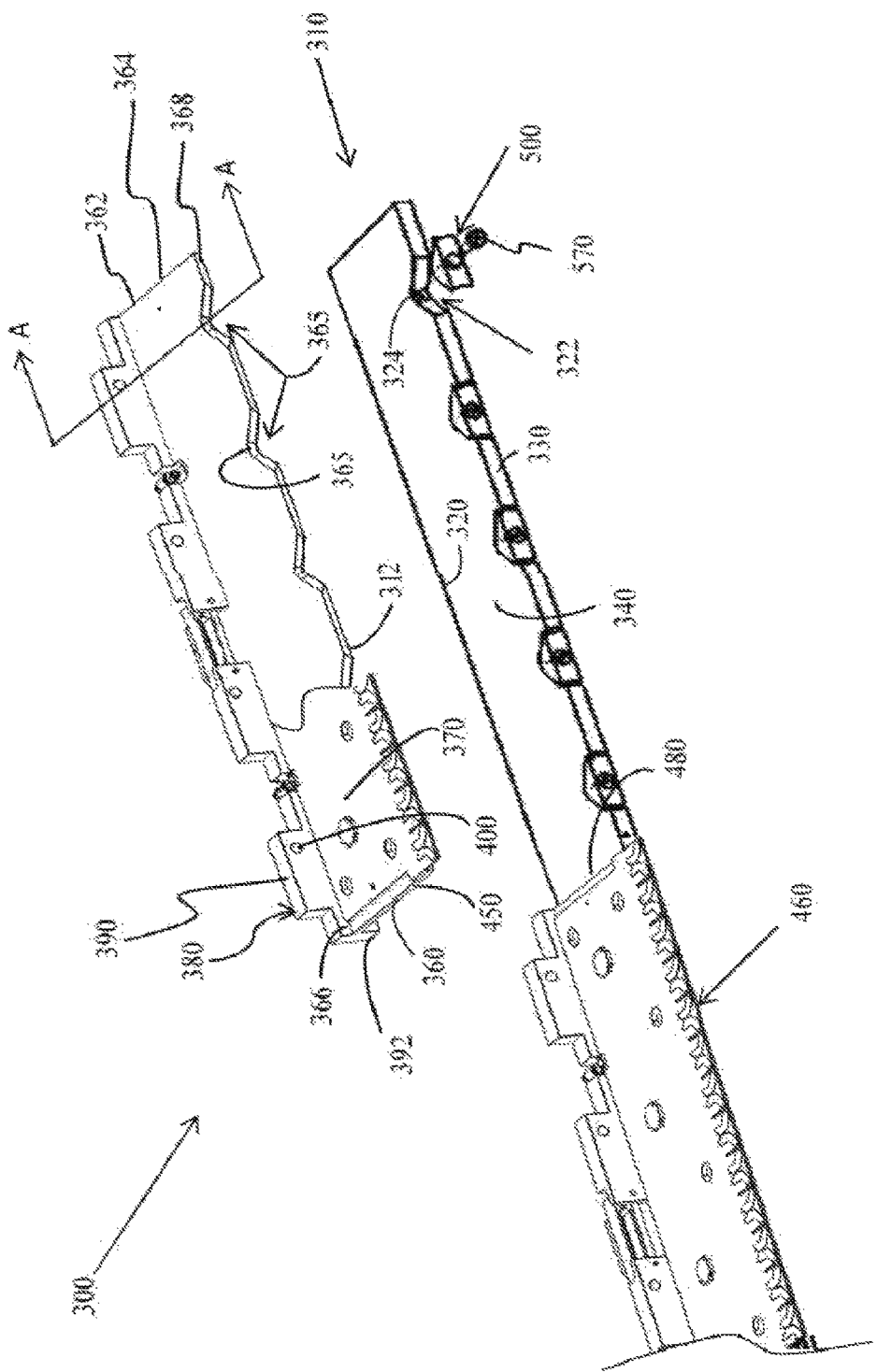
FIG. 4A is a partial perspective view of a circuit board assembly, in accordance with another example of the present disclosure, showing two slat assemblies (one in an elevated position above a rail) formed in accordance with an example of the present disclosure.
Figure 4B:
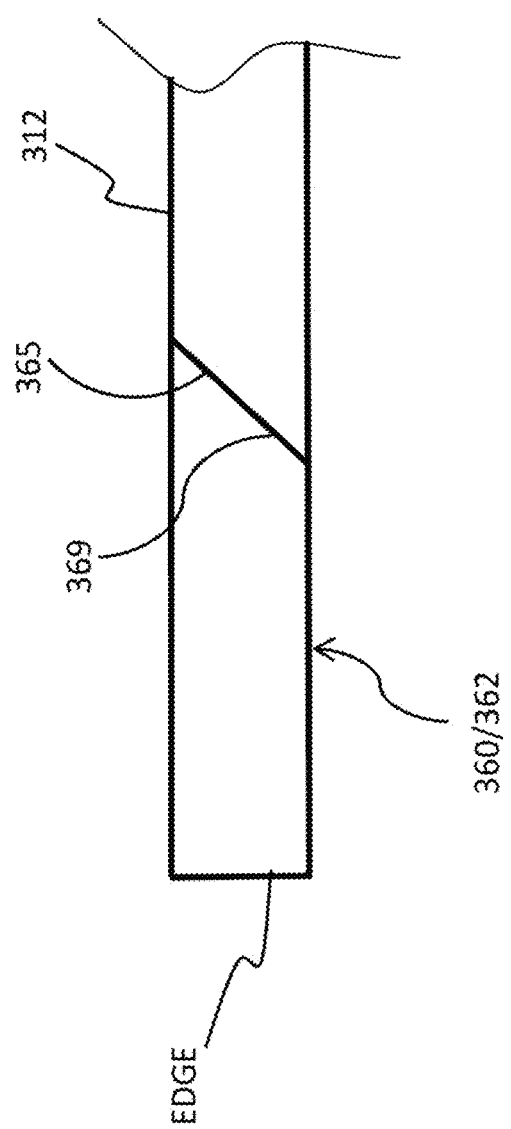
FIG. 4B illustrates a detailed partial cross-sectional view of the carrier plate of one of the slat assemblies of FIG. 4A taken along lines A-A.
Figure 5:
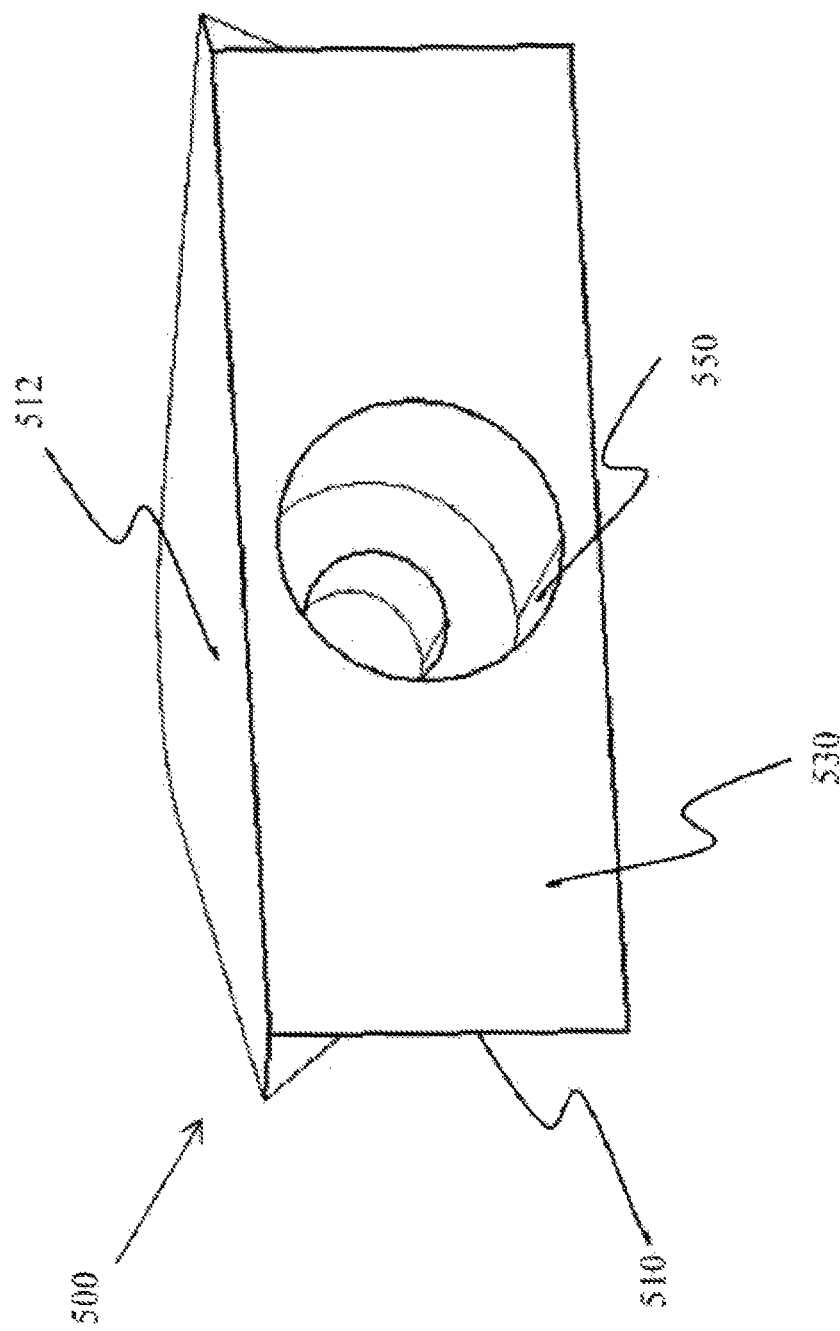
FIG. 5 is a front perspective view of a wedgelock in accordance with an example of the present disclosure.
Figure 6:
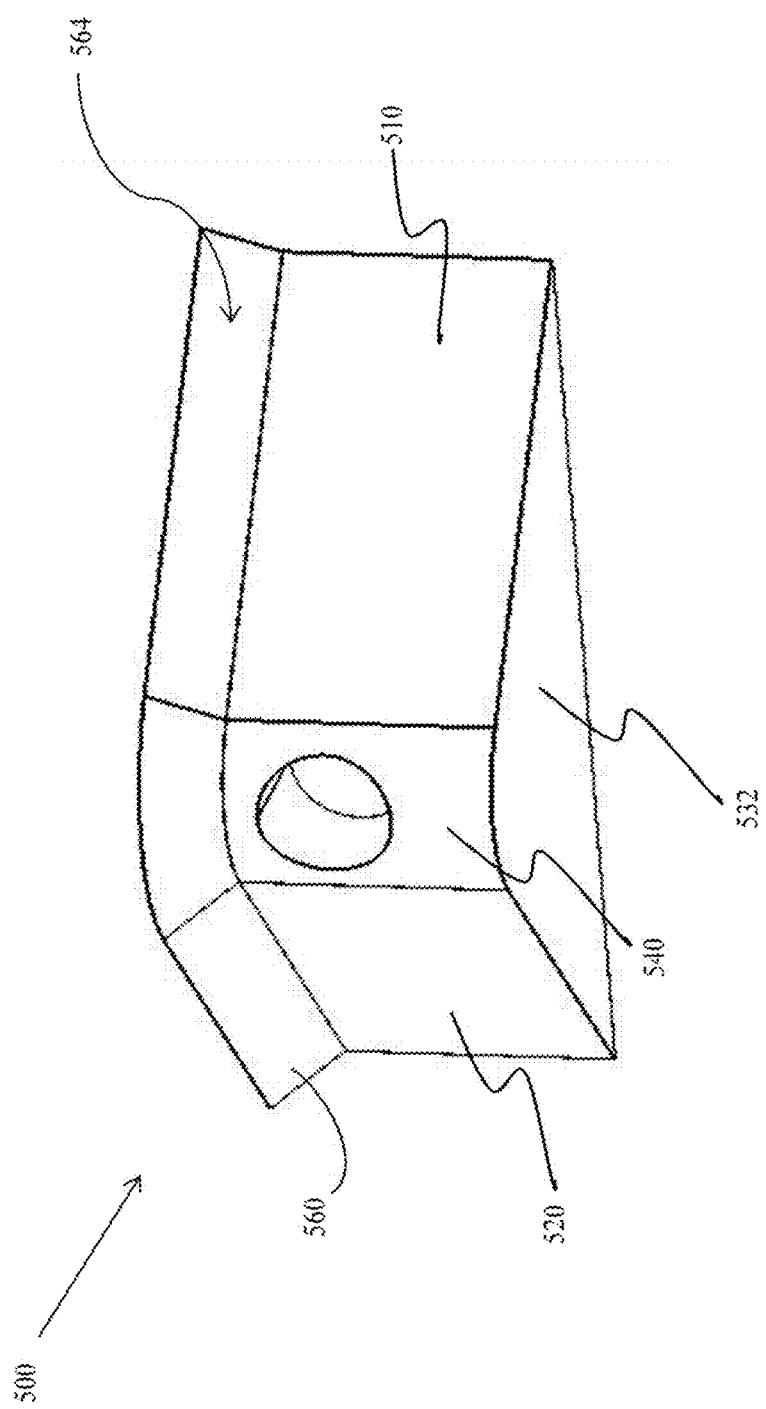
FIG. 6 is a rear perspective view of the wedgelock of FIG. 5.

With reference to FIG. 4A, the present technology further describes a circuit board assembly 300. The circuit board assembly 300 can comprise a rail 310. The rail 310 can comprise a first edge 320 and a second edge 330 opposite the first edge 320, and a major surface 340 extending between the first edge 320 and the second edge 330. As illustrated, the rail 310 can comprise a low-profile, high aspect ratio configuration.

The circuit board assembly 300 can further comprise a plurality of slat assemblies 350 supported about the major surface 340 of the rail 310. Each slat assembly 350 can further be coupled to the major surface, as described below. The slat assembly 350 can comprise a carrier plate 360 having a rail interface and a circuit board 370 mounted to the carrier plate 360.

The circuit board assembly 300 can further comprise a plurality of slat assemblies, such as, for example slat assembly 350 and slat assembly 460. The plurality of slat assemblies 350 and 460 can be positioned adjacent one another along and can be independently removably mounted to the rail 310, with the rail 310 providing structural support for the slat assemblies. As illustrated in FIG. 4, slat assembly 350 and slat assembly 460 are configured to be positioned adjacent one another on the rail 310, with end interface 450 of the slat assembly 350 and an end interface 480 of the slat assembly 460 facing one another. In one aspect, the end interface 450 and the end interface 480 can be positioned directly adjacent one another, such that the end interface 450 and the end interface 480 are caused to be in contact with and engage one another. In another aspect, the end interface 450 and the end interface 480 can be positioned directly adjacent one another, such that the end interface 450 and the end interface 480 are caused to be slightly separated and not in direct contact with one another, such that a separation distance or gap exists between them.

Figure 7:
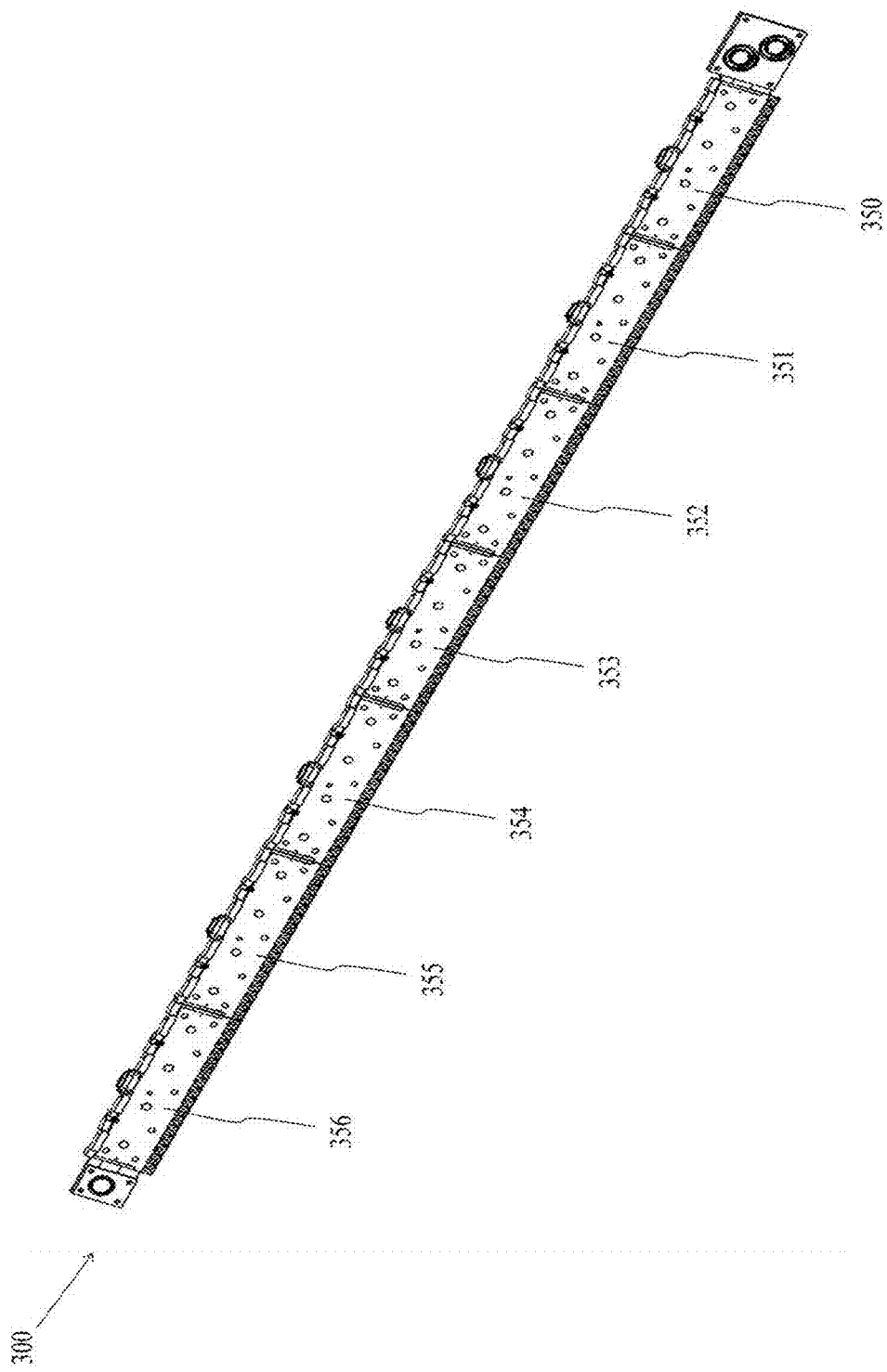
FIG. 7 is an elevation view of the circuit board assembly of FIG. 4, showing the rail in support of a plurality of slat assemblies.

In further embodiments, the circuit board assembly 300 and the plurality of slat assemblies can comprise additional slat assemblies, such as, for example, three slat assemblies, four slat assemblies, and so on as required for the technological application, or as the rail 310 can accommodate. For example, FIG. 7 illustrates the rail 310 supporting a plurality of slat assemblies 350-356. As shown in FIG. 7, the first slat assembly 350 is supported adjacent the second slat assembly 351. The second slat assembly 351 is supported adjacent the third slat assembly 352. The remaining slat assemblies 353-356 are positioned in a similar manner over the majority of the length of the rail 310. The various slat assemblies 350-356 can be coupled to or otherwise engaged with one another, or mounted with a separation gap or distance between them. In any event, the rail 310 can support a plurality of slat assemblies thereon, wherein a circuit board assembly is formed.

Referring again to FIGS. 4A and 7, the slat assembly 350 (slat assemblies 351-356 can be similarly configured) can comprise a carrier plate 360 having a base 362 having a mounting surface 364. The mounting surface 364 can be operable to at least partially support a circuit board 370. The base 362 can comprise a first edge 366 and a second edge 368 opposite the first edge 366. In some embodiments of the invention, the carrier plate 360 can also comprise a back surface 312. The back surface 312 can be the surface located opposite the mounting surface 364. The back surface can be operable to contact and rest upon the mounting surface of the rail. In one non-limiting example, the bearing stress at the interface between the slat assembly 350 and the rail 310 can be approximately 32 PSI. As a result, in some cases anodizing the back surface 312 of the carrier plate 360 may not be necessary. In some embodiments there may be a need to provide electrical conductivity between the back surface 312 and the rail 310. In such embodiments, the back surface 312 can receive a hard-facing treatment, such as Sulfuric Acid Anodize or Hard Coat Anodize. The hard-facing treatment can be effective to ensure that there is electrical conductivity between the rail 310 and the carrier plate 360, and that there is electrical conductivity at the interface between the rail 310 and the carrier plate 360. Electrical conductivity is to be considered for proper grounding, both for safety and for EMI considerations.

The slat assembly 350 can further comprise at least one array plate segment 380. The at least one array plate segment 380 can be positioned about the first edge 366 of the base 362. The at least one array plate segment 380 can comprise a first member 390 extending above the mounting surface 364, and a second member 392 extending below the mounting surface 364, such that the at least one array plate segment 380 can be operable to nest with an adjacent array plate segment on a second carrier plate, in a similar manner as the nesting configuration discussed above with respect to FIG. 3B.

The circuit board assembly 300 can further comprise a slat assembly securing component operable to secure the slat assembly 350 to the rail 310. As illustrated in FIG. 4A, the slat assembly securing component can comprise a locking device in the form of a spring loaded wedgelock 500.

Referring now to FIGS. 4A-6, the wedgelock 500 will be described in greater detail. As shown, the wedgelock 500 can comprise a first side 510 and an upper surface 512. The wedgelock 500 can further comprise a second side 520, a front side 530, a lower surface 532, and a rounded end 540 that transitions between the first and second sides 510 and 520. The first side 510, the second side 520, the front side 530, the upper surface 512, the lower surface 532, and the end 540 can combine to form a triangular shaped wedge configured to couple the rail 310 and slat assembly 350 of the circuit board assembly 300.

The wedgelock 500 can further comprise a tapered edge 560. The upper surface 512 can extend beyond each of the first side 510, the second side 520, and the end 540. The tapered edge 560 can extend from the extended portion of the upper surface 512 to a location on each of the first side 510, the second side 520 and the end 540 so as to form a flange or flange-like structure 564. Stated differently, the wedgelock 500 can comprise a flange 564 about the upper surface 512 that extends or protrudes beyond the first, second sides 510, 520 and the end 540. The tapered edge 560 (and the formed flange) can extend continuously about the first side 510 and the second side 520, as illustrated. The wedgelock 500 can further comprise an opening 550 operable to receive a fastener and spring-type component. The wedgelock 500 can be operable to secure, at least in part, the slat assembly 350 to the rail 310, as discussed herein below.

The rail 310 can further comprise at least one notch 322 formed therein. The notch 322 can comprise a substantially similar or matching shape and configuration as the wedgelock 500, such that the wedgelock 500 can be received within the notch 322. In other words, the notch 322 can comprise sides or edges that correspond to the sides/surfaces of the wedgelock 500. In the embodiment shown, the notch 322 is shown as being formed in the second edge 330 of the rail 310, thus permitting or facilitating coupling of the slat assembly 350 to the rail 310 from a rearward position of the rail (as referenced in relation to the electronics circuit array described below). In this example, the rail 310 is shown as comprising a plurality of similarly configured notches that perform a similar function as the notch 322.

The wedgelock 500 can be received within the at least one notch 322 and can be coupled to the rail 310. In one aspect, the wedgelock 500 can be coupled to the rail 310 by inserting a fastener 570 through the opening 550 of the wedgelock 500. The fastener 570 can be operable to extend through the opening 550 of the wedgelock 500 and into an opening 324 formed within the notch 322 of the rail 310. The fastener 570 can comprise any suitable fastener, such as, for example, a shoulder screw. The fastener 570 can be combined with a Belleville washer, a coned-disc spring, a conical spring washer, a disc spring, a cupped spring washer, or other similar "spring-type" component operable with the fastener to help couple the wedgelock 500 to the rail 310, and to provide and maintain a desired spring biased connection, or in other words to provide a spring loaded coupling of the wedgelock 500. The "spring-type" component and spring loaded coupling function facilitates the pressure to be applied to the wedgelock 500 to allow the wedgelock 500 to properly secure the slat assembly 350 to the rail 310.

The tapered upper edge 560 and the formed flange 564 of the wedgelock 500 can further be configured and operable to engage the rail interface of the base of the carrier plate 360 of the slat assembly 350 to secure the slat assembly 350 to the rail 310. More specifically, the carrier plate 360 can further comprise a rail interface that can comprise a plurality of notches 365 formed in the carrier plate 360. The plurality of notches 365 can be formed in the base 362 along some or all of the second edge 368 of the base 362. In some embodiments, each of the plurality of notches 365 can comprise a "V" shape, extending inward from the second edge 368 toward the first edge 366, and can have a rounded end 367. Additionally, each of the plurality of notches 365 can comprise a tapered edge 369 which can be configured to correspond with the tapered edge 560 of the flange 564 of the wedgelock 500.

The configuration of the notches 365 can correspond both to the shape/configuration of the notches (e.g., notch 322) in the rail 310 and to that of the wedgelock 500 so that these can essentially mate with one another. The plurality of notches 365 in the carrier plate 360 can be operable to interface with the wedgelock type locking device, described herein, to secure the carrier plate 360 (and the entire slat assembly) to the rail 310. The respective wedgelock type locking devices can each comprise a shape operable to fit within the plurality of notches 365 to engage both the carrier plate 360 and the rail 310 so as to secure the carrier plate 360 to the rail 310.

Figure 8:
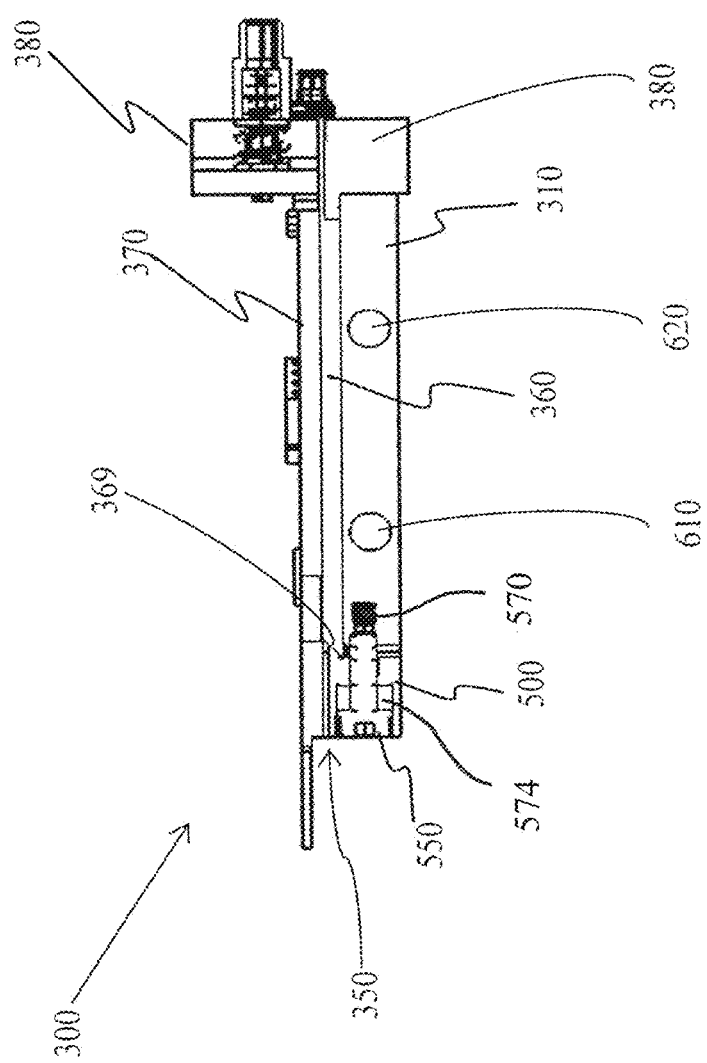
FIG. 8 is a cross-sectional view of the circuit board assembly of FIG. 4 illustrating a wedgelock interfacing with components of the circuit board assembly in accordance with an example of the present disclosure.
Figure 9:
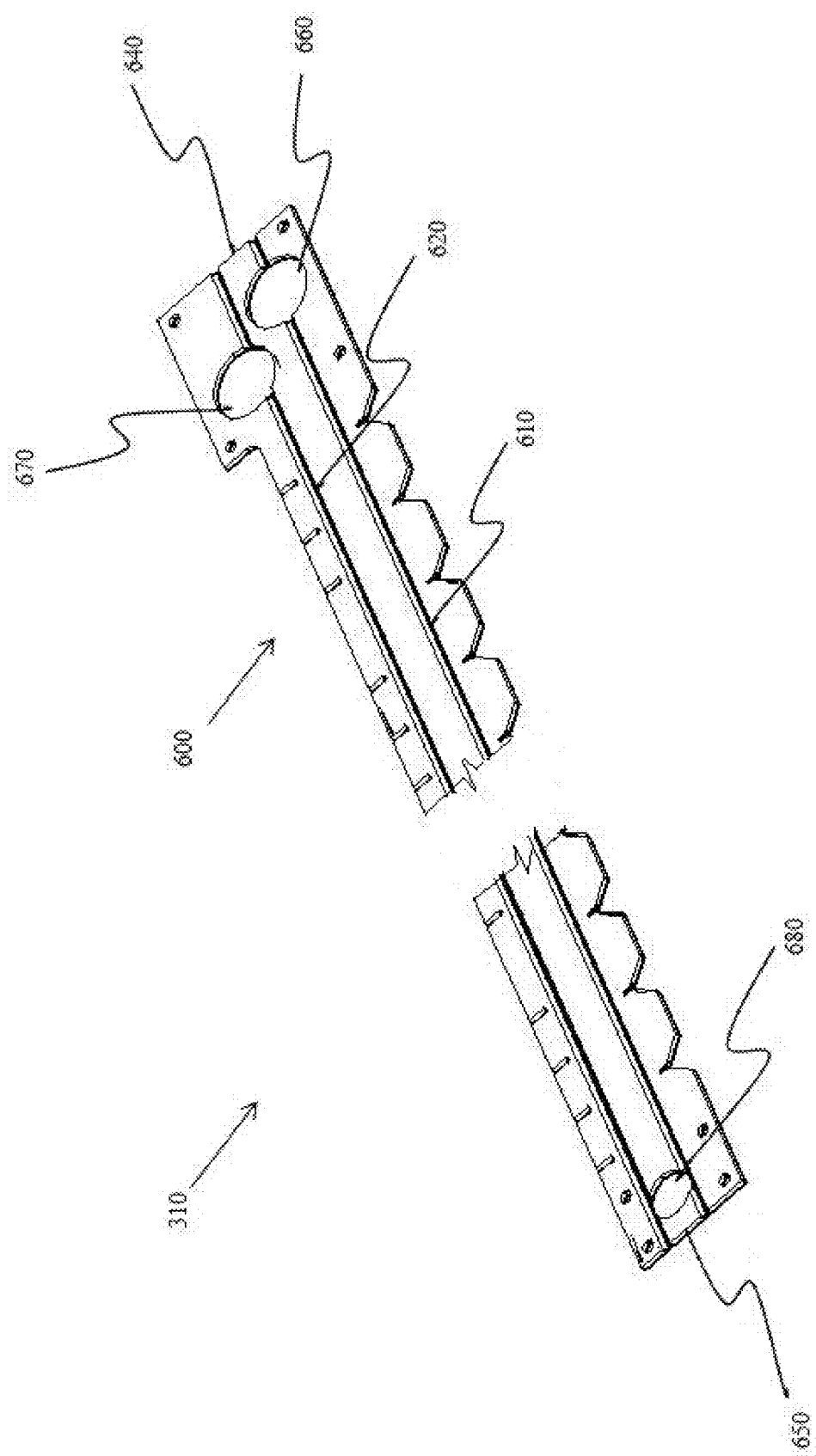
FIG. 9 is a cross-sectional view of the circuit board assembly of FIG. 4 illustrating parts of a cooling system in accordance with an example of the present disclosure.

FIG. 8 illustrates a cross-sectional side view of the slat assembly 350 as secured to the rail 310 using the wedgelock 500. Referring to FIGS. 4A-8, the slat assembly 350 with its carrier plate 360 and circuit board 370 mounted thereto, can be positioned about the major surface 340 of the rail 310. Positioning of the slat assembly 350 about the rail 310 can comprise aligning the various notches 365 on the carrier plate 360 with the notches 322 formed in the rail 310. Once the slat assembly 350 is in position, the wedgelock 500 can be received within one of the notches 365 of the carrier plate 360 to cause the wedgelock 500 to engage both the carrier plate 360 and the rail 310. In doing so, the various sides of the wedgelock 500 can be caused to engage the rail 310 or the rail and the carrier plate 360. In addition, in the case in which the wedgelock 500 comprises a flange 564, the tapered edge 560 of the flange 564 of the wedgelock 500 can be caused to engage the tapered edge 369 of the carrier plate 360. Thus, the wedgelock locking device 500 is caused to interface with and span across and engage both the carrier plate 360 and the rail 310. The flange 564 of the wedgelock 500, and the associated angled interface between the tapered edge 560 of the wedgelock 500 and the tapered edge 369 of the carrier plate 360, can function to essentially apply a multi-directional clamping force to the slat assembly 350 and the rail 310 with the wedgelock 500 applying inward and downward forces about one side of the rail 310 resisted by the forces applied about the opposite side of the slat assembly 350 by way of the fastening or securing of the array plate segments 380 to the rail 310 as discussed herein.

In one aspect, the wedgelock 500 can be configured such that the upper surface 512 does not extend above the mounting surface 364 of the carrier plate 360, but rather is flush with the mounting surface 364 when the wedgelock 500 is installed. In another aspect, the wedgelock 500 can be configured to have a slightly less height or profile than the slat assembly 350, such that, when in place, it is located out of contact with the circuit board 370.

Once in place, the wedgelock 500 can be secured in place using a fastener or fastening system, such as a shoulder screw 570 and a Belleville washer 574 or similar spring-type component that functions to facilitate the application of pressure to the wedgelock 500. This coupling arrangement causes the slat assembly 350 to be biased relative to the rail 310. The fastener or fastening system can be configured to be inserted into the opening 550 of the wedgelock 500 and into the opening 324 within the notch 322 of the rail 310. This functions to lock the carrier plate 360 and the slat assembly 350 in place about the rail 310.

In some cases, it is contemplated that the tapered edge 369 of the carrier plate 360 can comprise an anodized or other suitably finished surface. The anodized surface can comprise a hard-facing sulfuric acid anodize. The anodized surface can be operable to accommodate a high bearing at the interface between the tapered edge 369 and the tapered edge 560 of the wedgelock 500. In some embodiments, the anodized surface can be operable to accommodate a bearing stress at the interface in excess of 140 PSI.

With reference to FIGS. 4A, and 8-11, the rail 310 can further comprise a cooling system 600 operable to conduct a cooling fluid through the rail 310 to cool the circuit board 370 supported thereon. The cooling system 600 can comprise an inlet channel 610 and an outlet channel 620 for facilitating the flow of the cooling fluid through the rail 310. The inlet channel 610 can be in fluid communication with the outlet channel 620, and these can be configured and positioned in a variety of different ways. As in the example shown, the inlet and outlet channels 610 and 620 can be configured as channels or bores formed within the rail 310. They can be further configured to run parallel to one another along the longitudinal axis of the rail 310, whereby the cooling fluid can be conducted about the rail 310 (and the circuit board 370) in different directions.

The cooling fluid conducted through the inlet channel 610 and the outlet channel 620 can comprise a propylene glycol-water mixture. In one aspect, the ratio of these can be 30/70, or substantially close to 30 percent propylene glycol and 70 percent water. The cooling system 600 can be designed so that the coolant fluid fluctuates within a specified number of degrees in temperature. In one example, the cooling system can be designed such that the cooling fluid rises in temperature no more than 2.0 degrees Celsius from the inlet to the outlet. Each rail in a rail array can have a volume flow of substantially 0.26 gallons per minute.

The cooling system 600 can further comprise an inlet port 660 at a first end 640 of the rail 310 in fluid communication with the inlet channel 610. The inlet port 660 can be formed as an aperture in the rail 310, and can be operable to receive the cooling fluid from a fluid source (not shown). Indeed, the cooling system 600 can further comprise a fluid source operable with a pump or other system or device capable of facilitating flow of the cooling fluid through the various other components of the cooling system 600. The cooling system 600 can further comprise an intermediate port 680 at a second end 650 of the rail 310, opposite the first end 640. The intermediate port 680 can be formed as an aperture in the rail 310, and can be in fluid communication with the inlet channel 610 and the outlet channel 620. The intermediate port 680 is operable to change a direction of flow of the coolant fluid as the fluid travels from the inlet channel 610 to the outlet channel 620, changing directions through the intermediate port 680, thus allowing the cooling fluid to travel about different areas or portions of the rail 310 to cool different areas or portions of the circuit board 370.

The cooling system 600 can further comprise an outlet port 670 located at the first end 640 of the rail 310, the outlet port 670 being in fluid communication with the outlet channel 620. The outlet port 670 can be formed as an aperture in the rail 310, and can be operable to conduct the cooling fluid away from the rail 310. The outlet port 670 can be located adjacent to the inlet port 660.

Figure 10:
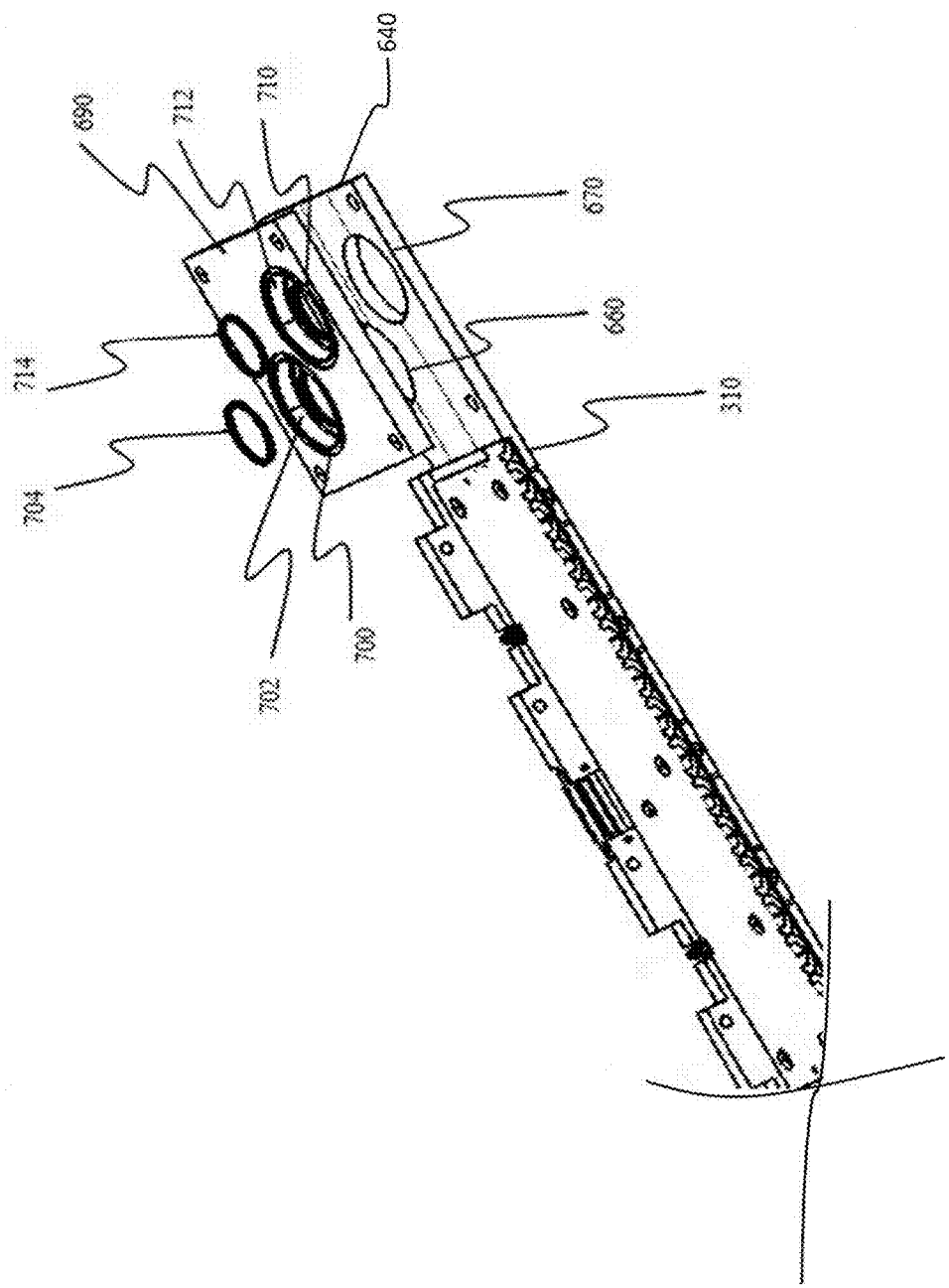
FIG. 10 is a partial perspective view of the circuit board assembly of FIG. 4 shown as further comprising a return and supply spacer as part of the cooling system of FIG. 9 and in accordance with an example of the present disclosure.
Figure 12A:
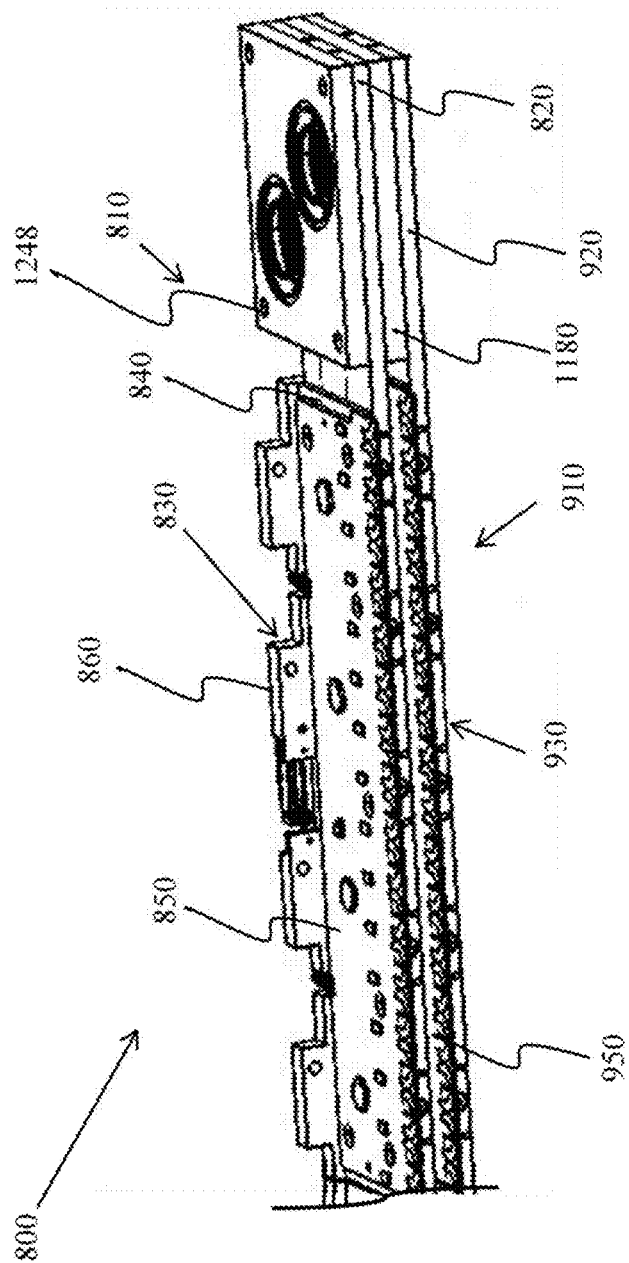
FIG. 12A is a partial front perspective view of one end of first and second circuit board assemblies in accordance with another example of the present disclosure, the circuit board assemblies forming at least a portion of a rear-loaded electronics array assembly.

The cooling system 600 can further comprise a return and supply spacer 690 (as illustrated in FIG. 10) positioned about the first end 640 of the rail 310. The return and supply spacer 690 can comprise a supply port 700 operable to align with the inlet port 660 formed in the rail 310. The return and supply spacer 690 can further comprise a return port 710 operable to align with the outlet port 670 formed in the rail 310. The return and supply spacer 690 is operable to engage the inlet port 660 and the outlet port 670 to facilitate flow of the cooling fluid between the rail 310 and an adjacent rail (not shown, but see the example of adjacent rails in FIG. 12A), and to ensure that the cooling fluid does not leak between the adjacent rails. The return and supply spacer 690 can also be configured to provide pitch spacing between the rail 310 and an adjacent rail.

The return and supply spacer 690 can further comprise a first pair of grooves 702 formed about opposing edges of the supply port 700. The first pair of grooves 702 can be operable to receive and have seated therein a first pair seals (e.g., O-rings) 704. The first pair of seals 704 can be operable to form a seal between the supply port 660 of the rail 310 and the return and supply spacer 690, and between the return and supply spacer 690 and an inlet port of an adjacent rail, respectively, so as to prevent leaking of the cooling fluid as it passes through adjacent inlet ports and supply ports of adjacent rails.

The return and supply spacer 690 can further comprise a second pair of grooves 712 formed about opposing edges of the return port 710. The second pair of grooves 712 can be operable to receive and have seated therein a second pair of seals (O-rings) 714. The second pair of seals 714 can be operable to form a seal between the outlet port 670 of the rail 310 and the return and supply spacer 690, and between the return and supply spacer 690 and an outlet port of adjacent rail, respectively, so as to prevent leaking of the cooling fluid as it passes through adjacent outlet ports and return ports of adjacent rails.

The cooling system 600 can further comprise a plugged spacer 730 located about the second end 650 of the rail 310 (as illustrated by the partial exploded view of FIG. 11). The plugged spacer 730 can be configured to be positioned between the rail 310 and an adjacent rail. The plugged spacer 730 can comprise a plug 732 operable to be aligned with the intermediate port 680 formed in the rail 310. The plugged spacer 730 can further comprise a pair of grooves 734 formed about opposing sides of the plugged spacer 730 operable to receive and support a pair of O-rings 736. The O-rings 736 can help to prevent the cooling fluid from leaking as the cooling fluid enters the intermediate port 680 from the inlet channel 610. A second, identical plugged spacer can be situated or positioned about the rail 310 and an another adjacent rail (not shown) on the opposite side of the rail 310. In addition, the second plugged spacer can be positioned so as to also align its plug with the opposite side of the intermediate port 680 between the rail 310 the adjacent rail. In this matter, the intermediate port 680 can be completely sealed closed, forcing any cooling fluid entering the intermediate port 680 through the inlet channel 610 to appropriately flow and exit out of the outlet channel 620 of rail 310 and the cooling system 600.

It is noted herein that it will be apparent to those skilled in the art that in some arrangements the inlet and outlet ports 660, 670, respectively, discussed above could be reversed. In addition, it will be apparent to those skilled in the art that in other arrangements, the intermediate port 680 could also function as an inlet or outlet port, with the intermediate port being located elsewhere along the rail.

With reference to FIGS. 12A-12E, illustrated is an example of a rear-loaded electronics array in accordance with another example, wherein a plurality of circuit board assemblies are adjacent and operable with one another. The plurality of circuit board assemblies can be configured similarly as the circuit board assembly examples discussed above, and can function similarly as discussed above. The rear-loaded electronics array 800 can comprise a first circuit board assembly 810. The first circuit board assembly 810 can comprise a rail 820 and at least one slat assembly 830 coupled to the rail 820. The at least one slat assembly 830 can be operable to be removed from the rail 820 from a rearward position, such as for repair or replacement.

The rear-loaded electronics array can further comprise a second circuit board assembly 910 adjacent the first circuit board assembly 810. The second circuit board assembly 910 can comprise a rail 920. The second circuit board assembly 910 can further comprise at least one slat assembly 930 coupled to the rail 920. The at least one slat assembly 930 can be operable to be removed from the rail 920 from a rearward position similar to the slat assembly 830. Installation and removal of the slat assembly 930 can be achieved by removing fastening bolts threaded into rails 820 and 920, ejecting the slat assembly 930 by way of the spring loaded wedgelocks 500, thus relieving pressure on both the tapered wedgelock surfaces 560 and 564, as well as the rail surface 340.

The first circuit board assembly 810 can be positioned adjacent the second circuit board assembly 910. Furthermore, the first circuit board assembly 810 can be coupled to the second circuit board assembly 910, such as via the array plate segments of the various slat assemblies, which can couple to at least two adjacent rails, as discussed herein, and via the components of the cooling assemblies of each circuit board assembly, as discussed herein.

The at least one slat assembly 830 of the first circuit board assembly 810 can further comprise a carrier plate 840 in support of a circuit board 850. The carrier plate 840 of the first circuit board assembly 810 can comprise a base (not shown) coupled to an array plate segment 860.

Figure 12B:
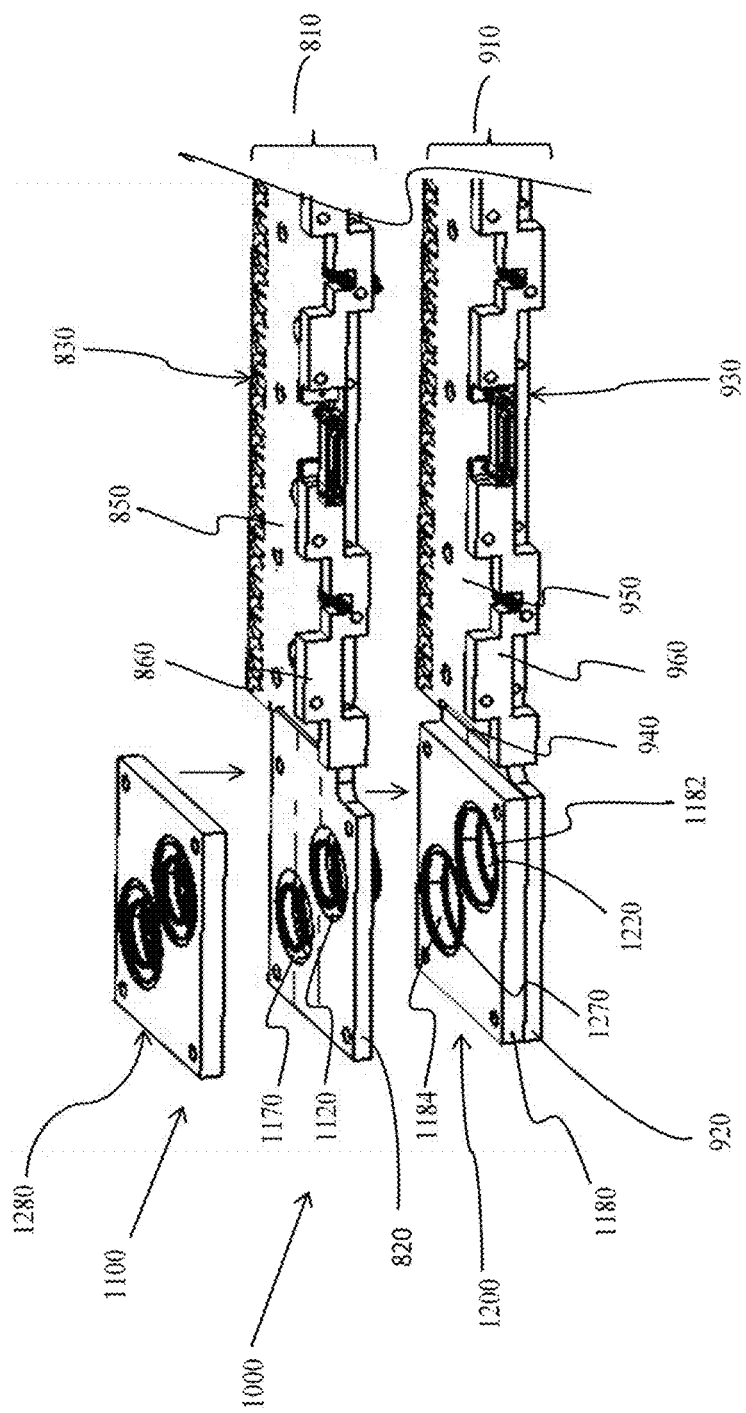
FIG. 12B is a partially exploded, partial perspective view of the first ends of the circuit board assemblies of FIG. 12A.
Figure 12C:
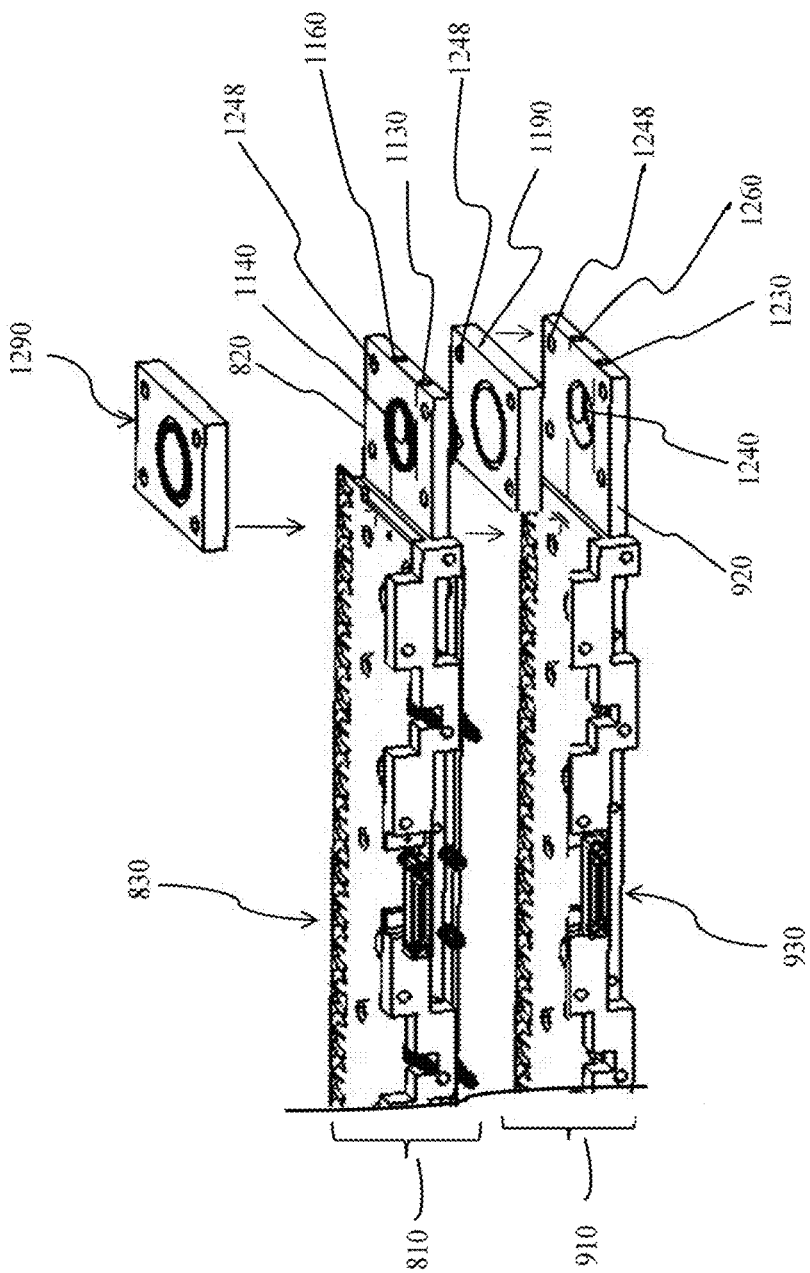
FIG. 12C is a partially exploded, partial perspective view of the second ends of the circuit board assemblies of FIG. 12A.
Figure 12D:
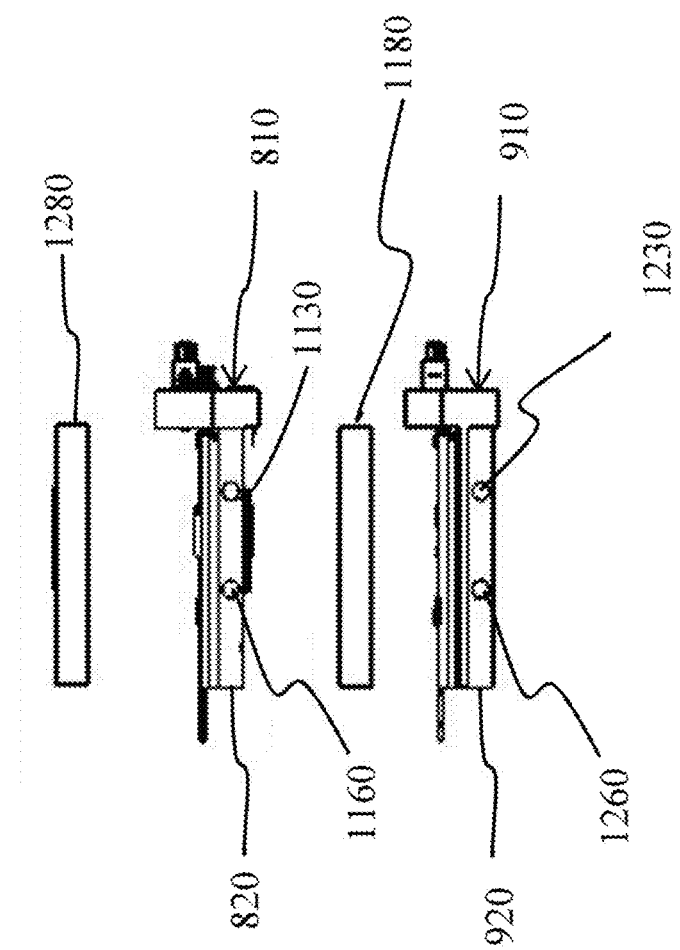
FIG. 12D is an exploded cross-sectional side view of the circuit board assemblies of FIG. 12A.

Likewise, the at least one slat assembly 930 of the second circuit board assembly 910 can further comprise a carrier plate 940 in support of a circuit board 950. The carrier plate 940 of the second circuit board assembly 910 can comprise a base (not shown) and an array plate segment 960. The array plate segment 860 and the array plate segment 960 can be arranged so as to be situated in a nesting configuration upon coupling together the adjacent circuit board assemblies 810, 910, as shown in FIG. 12B. The array plate segment 860 can be at least partially surrounded by the array plate segment 960.

Due to the low-profile, high aspect ratio of the rail 820 and the rail 920, they may tend to bow toward an adjacent rail during use. The nesting configuration shown in FIG. 12B can function to substantially reduce or eliminate any bowing the rails 820, 920 may experience during use. In some instances the array can experience bowing due to excessive forces acting upon the circuit board assemblies when in a stacked arrangement during use.

The rear-loaded electronics array 800 can further comprise an array cooling system 1000 that comprises each of the individual cooling system components, as described above, wherein the individual cooling system components can be configured to operate together to provide cooling to the entire rear-loaded electronics array 800. For example, as part of the overall array cooling system 1000, first and second circuit board assemblies 810, 910 can each comprise a cooling system 1100, 1200, respectively, that can function together to provide cooling to the electronics array 800.

The cooling system 1100 of the first circuit board assembly 810 can comprise an inlet port 1120 formed in the rail 820 at a first end of the first circuit board assembly 810, the inlet port being operable to receive a cooling fluid. The inlet port 1120 of the rail can be aligned with and can be in fluid communication with an inlet port 1220 of the second rail 920.

The cooling system 1100 of the first circuit board assembly 810 can further comprise an inlet channel 1130 in fluid communication with the inlet ports 1120, 1220, thus creating a fluid bus between circuit board assemblies 810, 910. Additionally, the inlet channel 1130 can be operable to conduct the cooling fluid through the first circuit board assembly 810.

The cooling system 1100 can further comprise an intermediate port 1140 at a second end of the first circuit board assembly 810. The intermediate port 1140 can be in fluid communication with the inlet channel 1130 and an outlet channel 1160, also operable to conduct fluid. Furthermore, the intermediate port 1140 can be operable to change a direction of flow of the cooling fluid.

The cooling system 1100 can further comprise an outlet port 1170 in the first circuit board assembly 810 in fluid communication with the outlet channel 1160. The outlet port 1170 can be operable to conduct cooling fluid away from or out of the first circuit board assembly 810. The outlet port 1170 can also be in fluid communication with the outlet port 1270 of the second circuit board assembly 910, which can be in fluid communication with the outlet channel 1260.

The cooling system 1100 can further comprise a return and supply spacer 1180 situated between the first rail 820 and the second rail 920. The return and supply spacer 1180 can provide the proper pitch spacing between adjacent rails, ensuring that adjacent rails are not too close to one another and do not contact one another during use. The return and supply spacer 1180 can aid in preventing damage to adjacent circuit board assemblies due to movement which can occur during use, which would otherwise create incidental contact between adjacent rails.

The return and supply spacer 1180 can comprise a supply port 1182 aligned with the inlet port 1120 of the first rail 820 and the inlet port 1220 of the second rail 920. The return and supply spacer 1180 can additionally comprise a return port 1184 aligned with the outlet port 1170 of the first rail 820 and the outlet port 1270 of the second rail 920. The various ports of the return and supply spacer 1180 can be in fluid communication with the various ports of the first and second rails 820, 920.

The return and supply spacer 1180 can further comprise a first pair of o-rings on each side of the return and supply spacer 1180 operable to form a fluid-tight seal between the inlet port 1120 and the supply port 1182 and between the supply port 1182 and the inlet port 1220 of the at least a second rail 920.

The return and supply spacer 1180 can further comprise a second pair of O-rings on each side of the return and supply spacer 1180 operable to form a fluid-tight seal between the outlet port 1170 and the return port 1184, and between the supply port 1182 and the inlet port 1284 of the at least a second rail 920.

An additional return and supply spacer 1280 can be similarly configured and can provide a similar function as return and supply spacer 1180, the return and supply spacer 1280 operable with the first circuit board assembly 810 and a third adjacent circuit board assembly (not shown).

The cooling system 1100 can further comprise a plugged spacer 1190 positioned between the first rail 820 and the second rail 920, and aligned with the intermediate port 1140 of the first rail 820 and the intermediate port 1240 of the second rail 920. The plugged spacer 1190 can be operable to block fluid flow between adjacent intermediate ports, and to constrain fluid flow within an associated circuit board assembly. The plugged spacer 1190 can comprise a pair of grooves on either side configured to receive and have seated therein a pair of O-rings. The pair of O-rings can seal any space between the plugged spacer 1190 and each of the first rail 820 and the second rail 920.

Similar to the return and supply spacer 1180, the plugged spacer 1190 can assist in providing the proper pitch spacing between adjacent rails 820, 920 and corresponding circuit board assemblies 810, 910. This can ensure that the adjacent rails are not too close to one another and do not contact one another during use. The plugged spacer 1190 can thus further aid in preventing damage to adjacent circuit board assemblies. A second similarly configured and functioning plugged spacer 1290 can be used between the first circuit board assembly 810 and a third circuit board assembly (not shown).

The cooling system 1100 operates to maintain the same mean average temperature at every point through the rail 820 and the corresponding circuit board assembly 810. When the cooling fluid enters the cooling channel 1130, the cooling fluid is at its coldest temperature. As the cooling fluid continuously travels through the inlet channel 1130 and extracts heat from the circuit board 850, the cooling fluid becomes continuously warmer, until it reaches its warmest temperature at the end of the outlet channel 1160. In some cases, the cooling system can be configured such that the average temperature of the cooling fluid in the inlet channel 1130 and the outlet channel 1160 is the substantially same at any given point along the inlet channel 1130 and the outlet channel 1160. This helps to maintain an even temperature across the circuit board 850.

In one example test using the example rear-loaded electronics array 800 shown, it was found that configuring the diameter of the inlet port 1120 and the outlet port 1170 to be 1.5 inches provided a nominal flow of 0.26 gallons per minute through the circuit board array with minimal variation. Of course, those skilled in the art will recognize that different diameters can produce different results depending upon the system desired to be achieved. Moreover, it will be apparent to those skilled in the art that the size and configuration of any of the structural elements discussed herein can vary to achieve a desired design and/or performance criteria.

In another example, the cooling system 1100 can comprise an inlet port offset from the outlet port in the manner shown. An offset arrangement can enable the inlet ports and/or the outlet ports to be larger than the other. In some cases, this may require enlarging the size of the rail. Increasing the size of the inlet port or the outlet port may allow for improved cooling of the associated circuit boards over other configurations. The associated fluid cooling channels within the cooling system of a circuit board assembly can also be different in size to further facilitate improved cooling, or at least different cooling functions.

In one specific example, the inlet port 1120 can comprise a diameter of 0.75 inches. In alternative examples, the inlet port 1120 can comprise a 1.0 or 1.5 inch diameter. Similarly, in one specific example, the outlet port 1170 can comprise a diameter of 0.75 inches. In alternative examples, the outlet port can comprise a diameter of 1.0 or 1.5 inches. The enlarged diameters of the inlet port 1120 and the outlet port 1170 can allow for increased fluid flow and more optimal cooling of the circuit board assembly 810. Those skilled in the art will recognize that other diameters are possible, but in many cases, the diameters of the inlet and outlet ports can range between 0.5 and 2 inches, depending upon design and/or performance desires.

It is noted that the cooling system 1200 of the second circuit board assembly 910 can comprise similar designs as the cooling system 1100.

The rear-loaded electronics array 800 can further comprise a set of openings 1248 in the first end of the rail of each of the first circuit board assembly 810 and the second circuit board assembly 910. The set of openings 1248 can be aligned with a similar set of openings found in the return and supply spacer 1180, as well as in the second circuit board assembly 910. A similar set of openings 1248 can be formed in the second ends of the respective rails 820, 920. These openings can be aligned with a similar set of openings formed in the plugged spacer 1190. The openings can be aligned as extending between the intermediate port 1140, the intermediate port 1240, and the plugged spacer 1190.

Figure 12E:
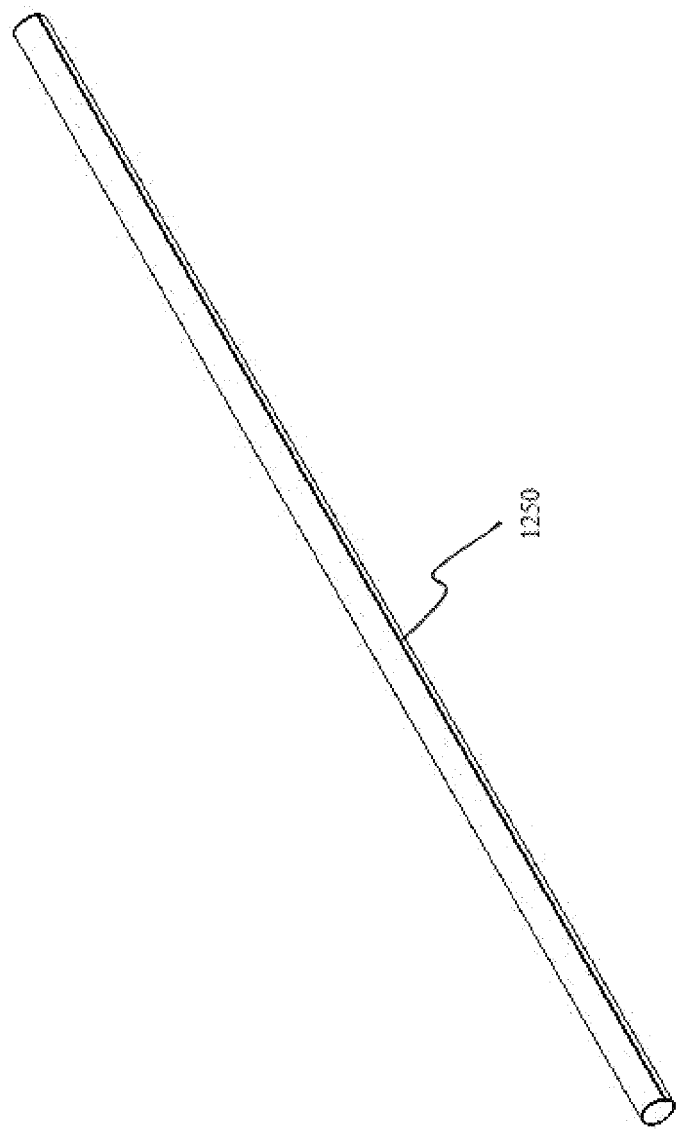
FIG. 12E is a perspective view of a precision rod formed in accordance with an example of the present disclosure, the precision rod forming part of the rear-loaded electronics array.

The rear-loaded electronics array can further comprise a set of precision rods, such as the precision rod 1250 shown in FIG. 12E, operable to be received within the set of openings 1248, and to extend through the plurality of circuit board assemblies. In the example shown, the precision rods 1250 can be operable to be inserted into the various openings 1248 to further facilitate coupling of the first circuit board assembly 830 to the second circuit board assembly 930. Depending upon the number of circuit board assemblies within a given rear-loaded electronics array, the precision rods 1250 can be any length needed to extend through and secure each of the plurality of circuit board assemblies present within the rear-loaded electronics array.

Figure 13:
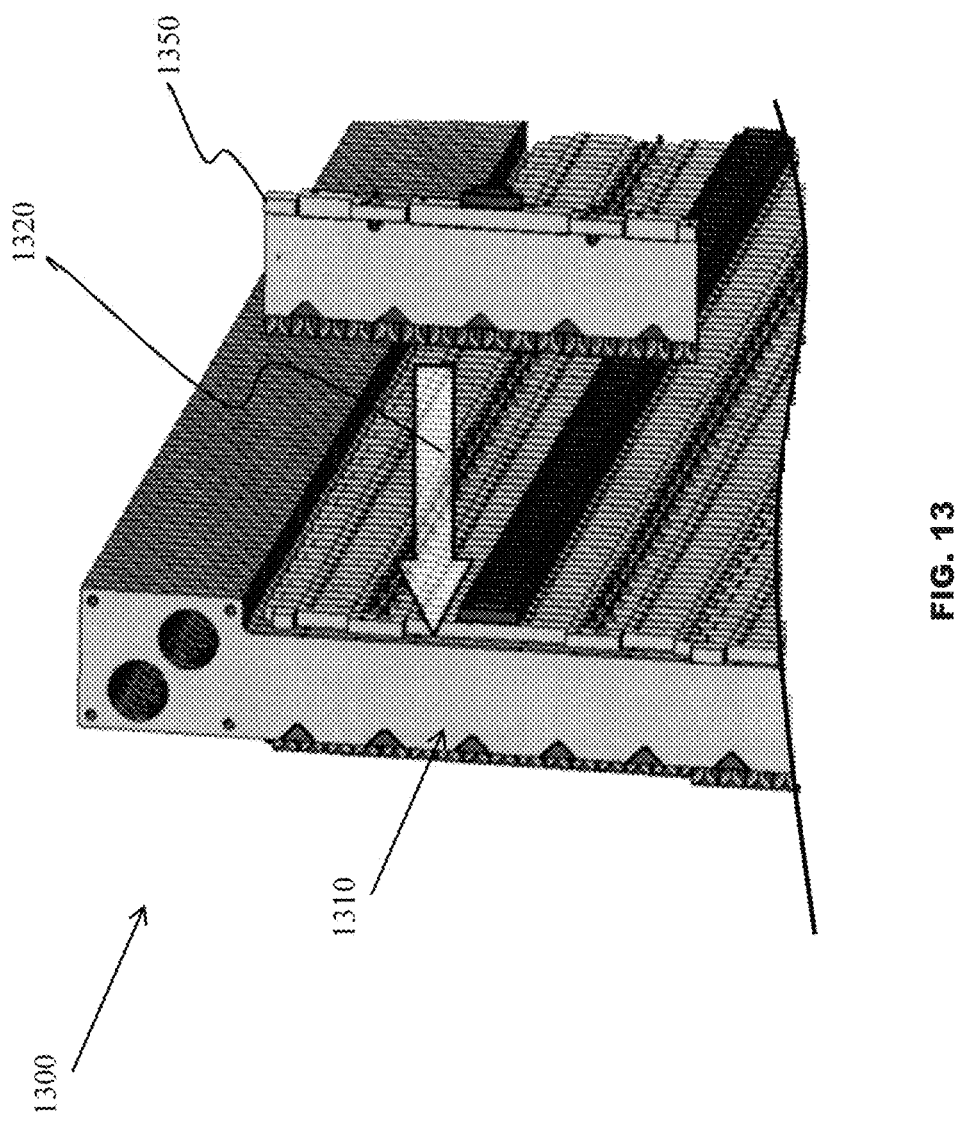
FIG. 13 is a partial perspective view of a rear-loaded electronics array in accordance with an example of the present disclosure.

FIG. 13 illustrates a rear-loaded electronics array 1300 comprising a plurality of circuit board assemblies stacked and arranged together as discussed herein. As shown, a slat assembly 1350 can be inserted into a rear-loaded electronics array from a rearward position, as indicated by arrow 1320. As can be seen, the electronics array 1300 can comprise several circuit board assemblies 1310, each having a plurality of slat assemblies supported about respective rails. In one specific embodiment, the electronics array 1300 can comprise up to 72 circuit board assemblies, each having dimensions of approximately 2.657 inches in length, and 0.25 inches in width. Additionally, each rail of the array assembly can support any number of slat assemblies. Embodiments shown here illustrate rails supporting up to seven slat assemblies. Of course, these dimensions and quantities are not meant to be limiting in any way as component numbers, dimensions, configurations, etc. across different electronics array assemblies can vary as needed or desired.

Further disclosed is an example method for configuring a rear-loaded electronics array. The method can comprise positioning first and second circuit board assemblies in the rear-loaded electronics array, the first and second circuit board assemblies each comprising a rail and at least one slat assembly comprising at least one circuit board supported about a carrier plate having at least one array plate segment. The method can further comprise securing the first and second slat assemblies to the rail from a rearward position.

The method can further comprise positioning the second circuit board assembly in the rear-loaded electronics array adjacent to the first circuit board assembly. The method can further comprise nesting an array plate segment of the first circuit board assembly with an array plate segment of the second circuit board assembly. Nesting the array plate segments of adjacent circuit board assemblies can help to provide strength and stability to the array, and can also eliminate bowing that can otherwise occur during use.

The method can additionally comprise coupling an array plate segment of the first slat assembly of the first circuit board assembly with the rail of a second circuit board assembly. Coupling an array plate segment of the first circuit board assembly with the rail of the second circuit board assembly can comprise securing, with a fastener, the array plate segment to the back of the rail. The method can further comprise configuring each of the array plate segments to receive a fastener operable to secure the array plate segment to the rail.

The method can further comprise coupling the first circuit board assembly to the second circuit board assembly. Referring to FIGS. 12A-12E, the method can comprise passing the set of precision rods 1250 through the set of openings 1248. The precision rod can couple multiple rails of an array assembly together, providing stability and preventing relative movement between adjacent rails or circuit board assemblies.

The method can further comprise aligning the rail 820 of the first circuit board assembly 810 with the rail 920 of the second circuit board assembly 910, such that the inlet port 1120 and the outlet port 1170 of the first circuit board assembly 810 are aligned with an inlet port 1220 and an outlet port 1270 of the second circuit board assembly 910, respectively. Aligning the inlet ports and the outlet ports of adjacent rails can further comprise aligning the inlet port 1182 and the outlet port 1184 of the return and supply spacer 1180 between the inlet port 1120 and the inlet port 1220 and the outlet port 1170 and the outlet port 1270, respectively.

The method can further comprise aligning the rail 820 with the rail 920, such that the intermediate port 1140 of the first circuit board assembly 810 and the intermediate port 1240 of the second circuit board assembly 910, respectively, are aligned. Aligning the intermediate ports 1140 and 1240 of adjacent rails can further comprise aligning the intermediate port 1140, the plugged spacer 1190, and the intermediate port 1240.

The method can additionally comprise regulating the temperature of the circuit board of the at least a first circuit board assembly 810. Regulating the temperature can comprise conducting cooling fluid through the inlet port 1120 of the first circuit board assembly 810. The cooling fluid can then be conducted from the inlet port 1120 to the first channel 1130 within the rail 820 of the first circuit board assembly 810. Thereafter, the cooling fluid can be conducted from the first channel 1130 to the intermediate port 1190 of the first circuit board assembly 810. Upon entering the intermediate port 1190, the method can comprise changing the direction of flow of the cooling fluid at the intermediate port 1190.

The method can thereafter comprise conducting the cooling fluid from the intermediate port 1190 to the second channel 1160 of the first circuit board assembly 810 within the rail 820 of the first circuit board assembly 810, the second channel 1160 being opposite the first channel 1120.

The method can further comprise conducting the cooling fluid from the second channel 1160 to the outlet port 1170 of the first circuit board assembly 810. The method can further comprise conducting a cooling fluid from the outlet port 1170 away from the first circuit board assembly.

In some embodiments, the method can further comprise conducting the cooling fluid through the inlet port 1120 to the inlet port 1220 of the second circuit board assembly 910. The method can comprise conducting the cooling fluid from the inlet port 1220 to a first channel 1230 within the rail 920 of the second circuit board assembly 910. Thereafter, the method can comprise conducting the cooling fluid from the first channel 1230 to an intermediate port 1240 of the second circuit board assembly 920. The method can further comprise changing the direction of flow of the cooling fluid at the intermediate port 1240 and conducting the cooling fluid from the intermediate port 1240 to a second channel 1260 of the second circuit board assembly 910 within the rail 920, the second channel 1260 being opposite the first channel 1230. Thereafter, the method can comprise conducting the cooling fluid from the second channel 1260 to the outlet port 1270 of the second circuit board assembly 910. The method can further comprise conducting the cooling fluid from the outlet port 1270 to the outlet port of an adjacent circuit board assembly.

In some embodiments, the method can further comprise fastening a locking device to the slat assembly and to the rail, thereby coupling the slat assembly to the rail.

Referring to FIG. 8, in some embodiments, the method can further comprise aligning at least one notch 366 on the slat assembly 350 with at least one recess 322 on the rail 310. The method can further comprise fastening the locking device, such as the wedgelock 500, within the at least one notch 366 and within the at least one recess 322, such that the wedgelock engages the at least one slat assembly 310 and the rail 350. Some embodiments of the method can comprise securing the wedgelock in place using fastener 570.

The method can further comprise removing the at least one slat assembly 350 from the rail 310 from a rearward position.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples of the present disclosure can be referred to herein along with alternatives for the various components thereof. It is understood that such embodiments, examples, and alternatives are not to be construed as de facto equivalents of one another, but are to be considered as separate and autonomous representations of the disclosed technology.

Furthermore, the described features, structures, or characteristics can be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the disclosed technology.

While the foregoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts discussed herein. Accordingly, it is not intended that the invention be limited, except as by the claims set forth below.

The invention claimed is:

1. A rear-loaded electronics array, comprising:
   a first circuit board assembly comprising a first rail and at least one first slat assembly removably coupled to the first rail; and
   a second circuit board assembly comprising a second rail and at least one second slat assembly removably coupled to the second rail,
   wherein the first rail is coupled to the second rail such that the first circuit board assembly is positioned adjacent the second circuit board assembly, and
   wherein the at least one first slat assembly is removable from the first rail, and the at least one second slat assembly is removable from the second rail while the first and second rails are coupled to one another within the electronics array.

2. The rear-loaded electronics array of claim 1, wherein the at least one first slat assembly further comprises a first carrier plate in support of a first circuit board, and wherein the at least one second slat assembly further comprises a second carrier plate in support of a second circuit board, the first and second carrier plates each comprising a base and an array plate segment, the array plate segments being arranged in a nesting configuration.

3. The rear-loaded electronics array of claim 1, wherein each of the first circuit board assembly and the second circuit board assembly further comprise a cooling system in fluid communication with one another.

4. The rear-loaded electronics array of claim 3, wherein the cooling system comprises an inlet channel and an outlet channel in fluid communication with the inlet channel.

5. The rear-loaded electronics array of claim 4, wherein the cooling system of the first circuit board assembly further comprises:
   an inlet port at a first end of the first rail in fluid communication with the inlet channel, the inlet port operable to receive a cooling fluid;
   an intermediate port at a second end of the first rail in fluid communication with the inlet channel and the outlet channel, wherein the intermediate port is operable to change a direction of flow of the coolant fluid; and
   an outlet port in fluid communication with the outlet channel, wherein the outlet port is operable to conduct the coolant fluid away from a circuit board of the first circuit board assembly.

6. The rear-loaded electronics array of claim 1, wherein the at least one first slat assembly further comprises a carrier plate and a circuit board mounted to the carrier plate.

7. The rear-loaded electronics array of claim 6, wherein the carrier plate comprises:
   a base having a mounting surface operable to at least partially support the circuit board, the base having a first edge and a second edge opposite the first edge; and
   at least one array plate segment positioned about the first edge of the base,
   wherein the at least one array plate segment comprises a first member extending above the mounting surface, and a second member extending below the mounting surface, such that the array plate segment is operable to nest with an adjacent array plate segment of a carrier plate of the at least one second slat assembly.

8. The rear-loaded electronics array of claim 1, wherein the at least one first slat assembly is coupled directly to the second rail.

9. The rear-loaded electronics array of claim 1, wherein the at least one first slat assembly further comprises a first carrier plate in support of a first circuit board, the first carrier plate comprising:
   a base having a mounting surface operable to at least partially support a circuit board, the base having a first edge and a second edge opposite the first edge; and
   at least one array plate segment positioned about the first edge of the base,
   wherein the at least one array plate segment comprises a first member extending above the mounting surface, and a second member extending below the mounting surface, such that the at least one array plate segment is operable to nest with an adjacent array plate segment of a second carrier plate of the second circuit board assembly.

10. The rear-loaded electronics array of claim 9, wherein the base comprises a rail interface operable to facilitate securing of the first carrier plate to the first rail.

11. The rear-loaded electronics array of claim 10, wherein the rail interface comprises a plurality of notches formed in the second edge of the base, the notches being operable to interface with respective locking devices supported about the first rail, the locking devices securing the first carrier plate to the first rail.

12. The rear-loaded electronics array of claim 11, wherein each of the plurality of notches comprises a tapered edge, and wherein the locking devices comprise a corresponding tapered edge operable to engage the tapered edge of the first carrier plate.

13. The rear-loaded electronics array of claim 12, wherein the tapered edge of the first carrier plate comprises an anodized surface.

14. The rear-loaded electronics array of claim 9, wherein the at least one array plate segment further comprises a connector interface operable to secure a connector supported about the first circuit board to the at least one array plate segment.

15. The rear-loaded electronics array of claim 9, wherein the at least one array plate segment further comprises an aperture through which a blind mate connector extends.

* * * * *